(12) United States Patent
Masuda

(10) Patent No.: US 7,110,426 B2
(45) Date of Patent: **\*Sep. 19, 2006**

(54) LASER BEAM GENERATING APPARATUS

(75) Inventor: Hisashi Masuda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/352,416

(22) Filed: Jan. 28, 2003

(65) Prior Publication Data

US 2003/0198261 A1    Oct. 23, 2003

Related U.S. Application Data

(63) Continuation-in-part of application No. 10/210,644, filed on Jul. 31, 2002, now abandoned.

(30) Foreign Application Priority Data

Aug. 6, 2001   (JP)   ............................ P2001-237593

(51) Int. Cl.
    *H01S 3/10* (2006.01)
(52) U.S. Cl. ....................................................... 372/21
(58) Field of Classification Search ............ 372/21–22, 372/43–44, 28, 32
    See application file for complete search history.

(56) References Cited

U.S. PATENT DOCUMENTS

| 6,403,966 B1 * | 6/2002 | Oka ............................ 250/372 |
| 2003/0006382 A1 * | 1/2003 | Spath et al. ............. 250/495.1 |

FOREIGN PATENT DOCUMENTS

JP   2001185795   * 7/2001

\* cited by examiner

*Primary Examiner*—Wilson Lee
*Assistant Examiner*—Hung Tran Vy
(74) *Attorney, Agent, or Firm*—Sonnenschein Nath & Rosenthal LLP

(57) ABSTRACT

A laser beam generating apparatus is configured such that a laser beam having a first wavelength obtained by a semiconductor laser containing gallium nitride is led in an external resonator using a nonlinear optical crystal. By allowing the laser beam to pass through the nonlinear optical crystal, an ultraviolet beam having a shorter wavelength is outputted as a laser beam. The wavelength of the ultraviolet beam becomes shorter by keeping the temperature of the nonlinear optical crystal at a low temperature. With this configuration, a laser beam in an ultraviolet region can be efficiently generated with a small apparatus.

15 Claims, 17 Drawing Sheets

F I G. 3
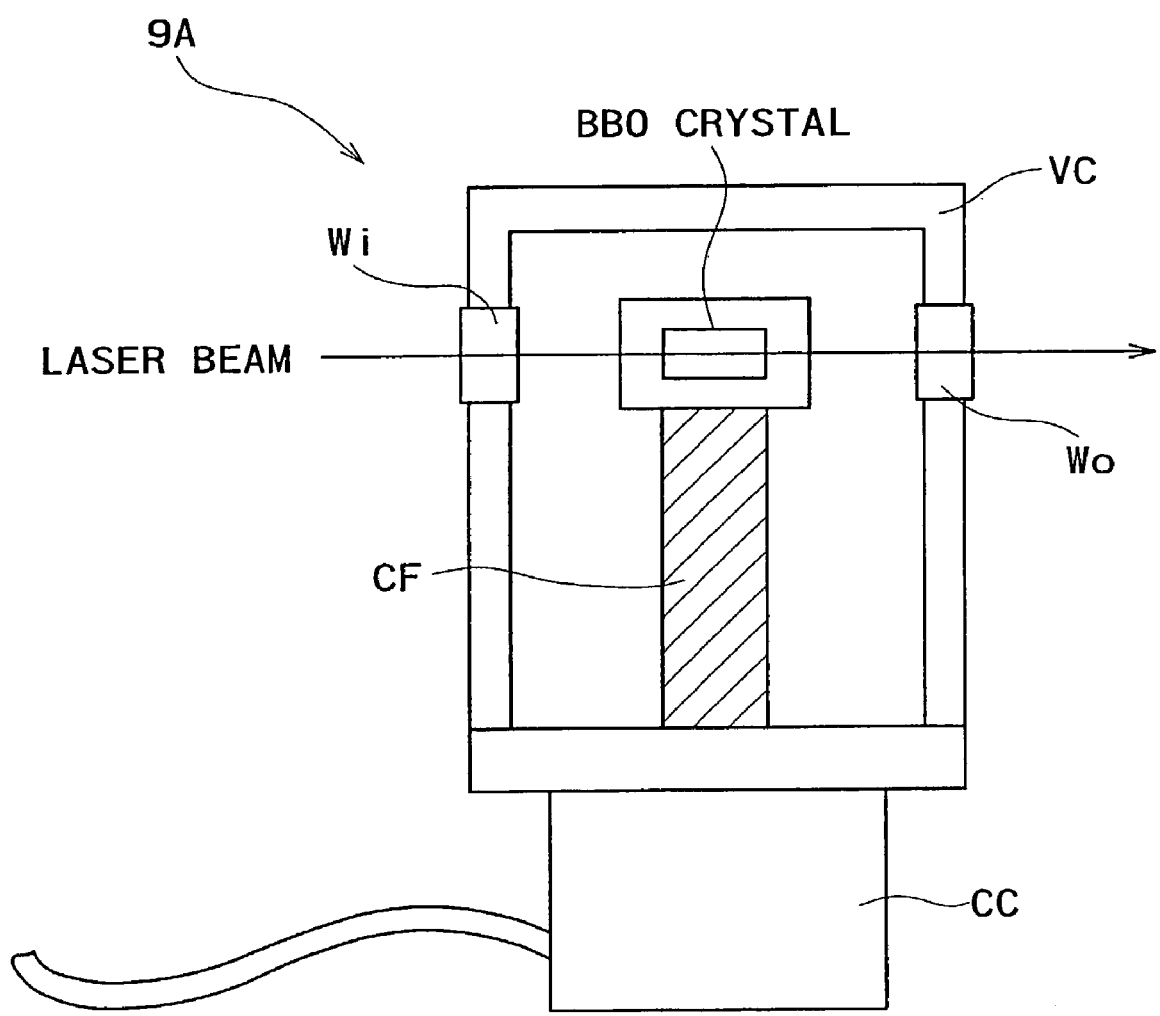

LASER BEAM GENERATING APPARATUS

RELATED APPLICATION DATA

The present application is a continuation in part application of U.S. Ser. No. 10/210,644 filed Jul. 31, 2002, now abandoned which claims priority to Japanese Application(s) No(s). P2001-237593 filed Aug. 6, 2001. This application claims priority to both of the foregoing applications, which application(s) is/are incorporated herein by reference to the extent permitted by law.

BACKGROUND OF THE INVENTION

The present invention relates to a technique for generating a laser beam in an ultraviolet region with a small apparatus.

To generate a laser beam in an ultraviolet region, for example, having a wavelength of about 200 nm (nanometer), a related art laser beam generating apparatus has been configured to:

(1) generate as a second harmonic of a pigment laser pumped by an excimer laser oscillating at a wavelength in the order of 300 nm and oscillating near 400 nm;

(2) generate as a fourth harmonic of a solid laser such as a titanium-sapphire laser or an alexandorite laser oscillating near at 800 nm; or (3) generate as a fifth harmonic of an Nd laser (for example, Nd:YAG laser) oscillating at a wavelength of about 1 μm.

Each of the above-described related apparatuses, however, has the following problems in terms of maintenance, efficiency, size, and the like.

In the apparatus described in (1), a gas used for the excimer laser has problems with poison and complicated exchange and the pigment laser has a problem with degraded maintenance. This apparatus, therefore, has a difficulty in industrial applicability.

In the apparatus described in (2), since the solid state laser is used, the maintenance is improved; however, a high output visible light source is required as a pumping source for the titanium-sapphire laser. This apparatus, therefore, has problems that the entire efficiency is low, and that the entire apparatus is enlarged so much.

The apparatus described in (3) requires the generation of a higher harmonic, and therefore, has problems that the final efficiency becomes low even if the efficiency of each stage is made high, and that it is difficult to generate continuous wave of the higher harmonic.

By the way, there has been reported a technique of obtaining a laser beam having a short wavelength by wavelength conversion with non critical phase matching (NCPM) of a BBO (barium borate) crystal. This technique has an advantage that there is no degradation of a rectangular ratio (aspect ratio) of a beam due to a walk off (which is an angle between a wave number and a pointing vector and is an index in the case where an angular difference is present between the normal line of the wave plane and the energy flow; however has a disadvantage in wavelength conversion efficiency. To be more specific, in this case, an effective nonlinear constant $d_{31}$ is only 1.8% of an effective nonlinear optical constant $d_{22}$, and since the output is nearly proportional to the square of the effective nonlinear optical constant $d_{31}$, the wavelength conversion efficiency is low. In particular, in the case of performing wavelength conversion for continuous waves, if the effective nonlinear optical constant is low, there occurs more serious problem because the wavelength conversion efficiency becomes significantly low even if an external resonator is used. Also, in the case of growing the BBO by a flux method, the growth rate is very low, failing to obtain a large-sized crystal having a homogeneous quality, with a result it is difficult to obtain a crystal having a long size. For such a crystal having a short size, an interaction length cannot be made longer, so that the BBO crystal obtained by the flux method is not advantageous in efficiency.

SUMMARY OF THE INVENTION

An object of the present invention is to provide a laser beam generating apparatus capable of efficiently generating a laser beam in an ultraviolet region and realizing miniaturization thereof.

To achieve the above object, according to an aspect of the present invention, there is provided a laser beam generating apparatus including: a semiconductor laser for outputting a laser beam having a first wavelength, said semiconductor laser containing gallium nitride; and an external resonator using a nonlinear optical crystal; wherein the output beam from said semiconductor laser is led in said external resonator so as to pass through said nonlinear optical crystal, to generate an ultraviolet beam having a second wavelength shorter than the first wavelength.

With this configuration, it is possible to obtain a laser beam having a shorter wavelength by leading a laser beam outputted from a semiconductor laser containing gallium nitride in a nonlinear optical crystal, and converting the wavelength of the laser beam by making use of a nonlinear optical phenomenon. Accordingly, the apparatus of the present invention is advantageous in miniaturization and efficiency.

BRIEF DESCRIPTION OF THE DRAWINGS

FIG. 3 is a view showing a modification of the structure for cooling the nonlinear optical crystal;

DETAILED DESCRIPTION OF THE PREFERRED EMBODIMENTS

The present invention relates to a laser beam generating apparatus capable of generating a laser beam in an ultraviolet region, particularly, in a deep ultraviolet region, that is, having a wavelength of about 200 nm or less.

The laser beam generating apparatus of the present invention will be described with reference to the accompanying drawings.

FIGS. 1 to 7 show one embodiment and its several modifications of the laser beam generating apparatus of the present invention.

Figure 1:
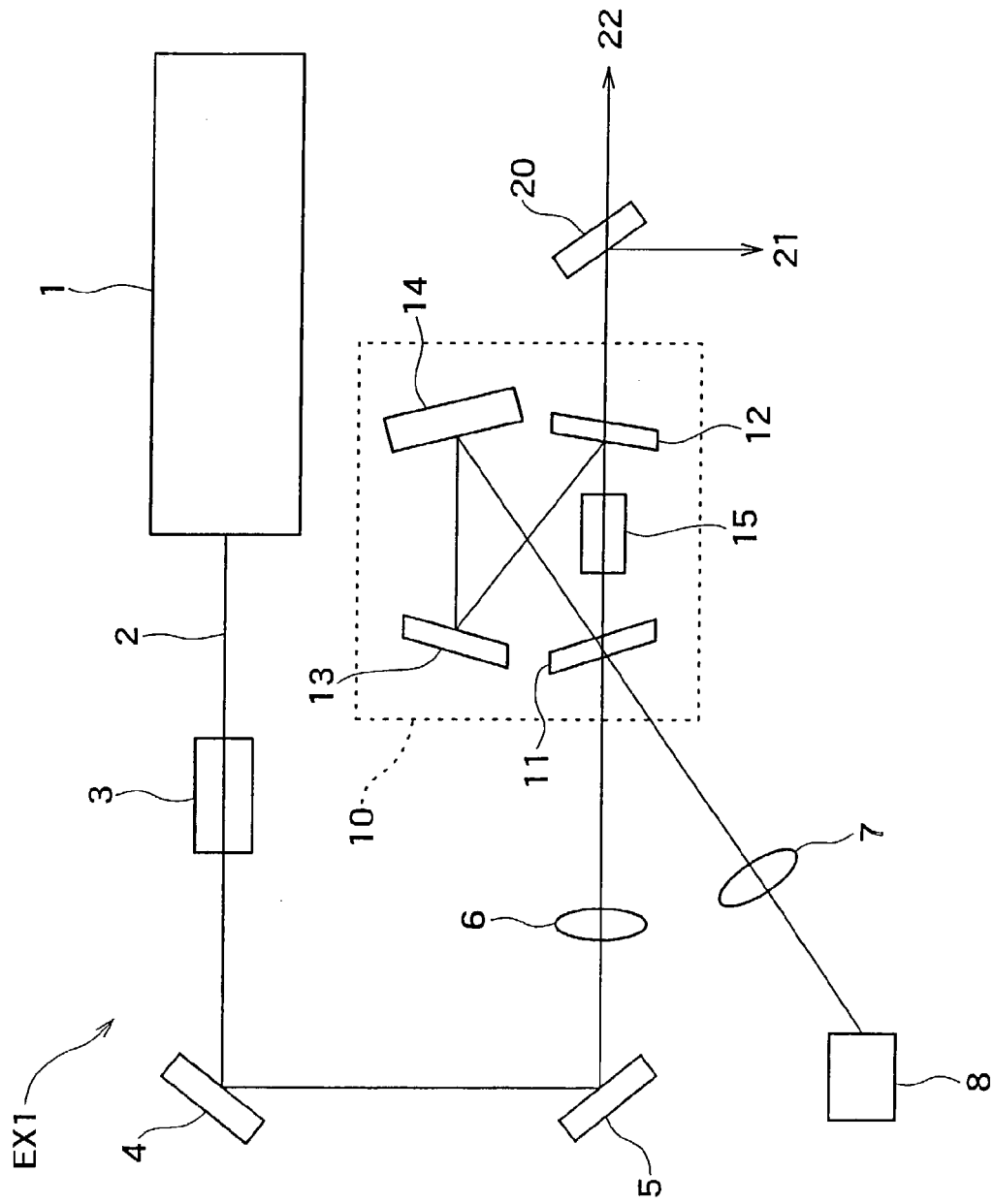
FIG. 1 is a diagram showing a configuration of a laser beam generating apparatus according to an embodiment of the present invention.

A laser beam generating apparatus EX1 according to the embodiment of the present invention shown in FIG. 1 includes a semiconductor laser 1, and an external resonator 10 using a nonlinear optical crystal (or nonlinear optical device) 15.

The semiconductor laser 1 as a light source is of a type containing gallium nitride. A laser beam outputted from the semiconductor laser 1 has a wavelength, for example, ranging from 409 nm to 415 nm in an ordinary temperature environment, or 360 nm to 415 nm in a low temperature environment (0° C. or less) of a nonlinear optical crystal. As one example, a gallium nitride (GaN) or indium gallium nitride ($In_{1-x}Ga_xN$) semiconductor laser allowed to be continuously oscillated with a wavelength of about 410 nm is used as the semiconductor laser 1.

The semiconductor laser 1 is desirable to be oscillated with a longitudinal single mode (or single longitudinal mode), and is thereby desirable to have a DFB (Distribution Feedback) type or DBR "Distribution Reflection" type periodical structure. Even if the semiconductor laser has not such an inner structure, that is, if the semiconductor laser is of either a single-mode or multi-mode type, the semiconductor laser may be configured as a nearly longitudinal single mode laser of an external control type (for example, Littrow type or Littman type) in which part of a laser beam outputted from the laser is separated or diffracted by a spectroscopic means such as a grating (for example, brazing type) or a prism to be fed back. Alternatively, a high output laser light source in which an output from the above-described laser light source is amplified is preferably used.

In the case of adopting the type in which part of a laser beam outputted from the laser is fed back via the spectroscopic means, to avoid instability due to formation of a composite resonator, an incident end face of the semiconductor laser may be covered with a reflection-reducing coating in order to realize a reflectance of 0.1% or less, preferably, 0.01% or less. With this configuration, a stable longitudinal mode operation can be obtained by wavelength selection. In addition, from the viewpoint of making effective use of light, a face, opposite to the incident end face, of the semiconductor laser may be covered with a coating realizing a high reflectance.

The output from the semiconductor laser 1 may be set to be 50 mW or more, preferably, 100 mW or more from the practical viewpoint.

A laser beam 2 outputted from the semiconductor laser 1 enters, as shown in the figure, the external resonator 10 by way of various optical devices. The external resonator 10 contains a nonlinear optical crystal 15. The nonlinear optical crystal 15 is exemplified by KBBF ($KBe_2BO_3F_2$), SBBO ($Sr_2Be_2B_2O_7$), or $MBF_4$ having a periodic polarization reverse structure where M is either of Mg, Zn, Fe, Co, and Ni. Such a nonlinear optical crystal is capable of converting a laser beam having a wavelength of 360 to 480 nm outputted from a gallium nitride (GaN) or indium gallium nitride ($In_{1-x}Ga_xN$) semiconductor laser into a beam having a wavelength of 180 to 240 nm by second harmonic generation (SHG). By placing such a nonlinear optical crystal in the external resonator for increasing the conversion efficiency, it is possible to obtain an output at a practical level. The nonlinear optical crystal can be also exemplified by barium borate ($\beta$-$BaB_2O_4$) crystal (hereinafter referred to as "BBO crystal") allowing phase matching under a condition of Type 1 (under which a higher harmonic of an ordinary light ray is obtained by incidence of two extraordinary light rays or a higher harmonic of an extraordinary light ray is obtained by incidence of two ordinary light rays). By placing such a nonlinear optical crystal in the external resonator, a laser beam having a wavelength of 409 to 415 nm can be converted into a beam having a wavelength of 204.5 to 207.5 nm by the second harmonic generation (SHG) at a temperature near room temperature.

The width of an application limit of the nonlinear optical crystal can be broadened by providing a means for keeping the temperature of the nonlinear optical crystal at a low temperature. For example, in the case of providing a temperature control means for keeping the temperature of the BBO crystal at a temperature of 0° C. (273K) or less, a laser beam having a wavelength in a range of 360 nm or more and 415 nm or less outputted from the semiconductor laser and made incident on the crystal is converted to a laser beam having a wavelength in a range of 180 nm or more and 207.5 nm or less by the second harmonic generation caused by a second harmonic generation or sum-frequency generating means.

Figure 2:
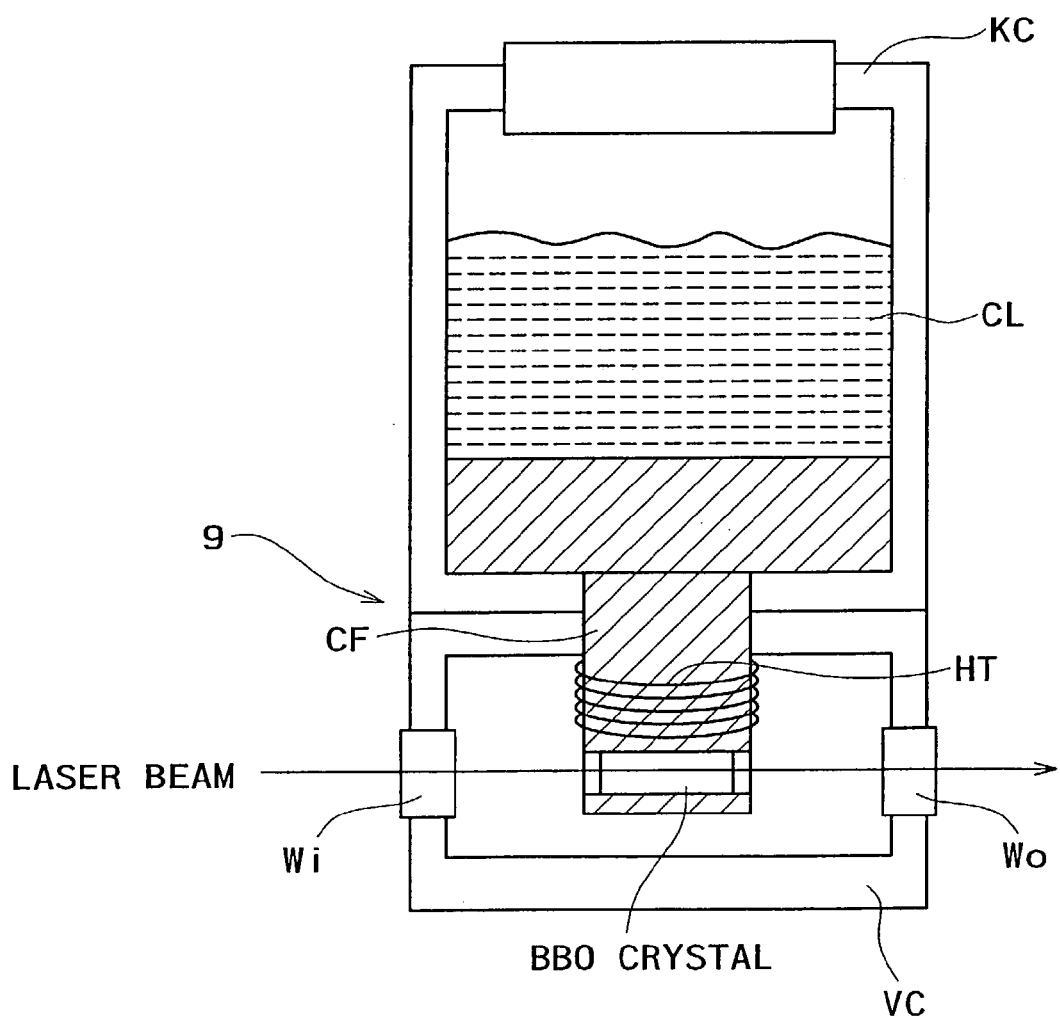
FIG. 2 is a view showing the outline of a structure for cooling a nonlinear optical crystal in the apparatus shown in FIG. 1.

FIG. 2 shows the outline of a structure for cooling the BBO crystal, wherein a cooling material (CL) such as liquid nitrogen or liquid helium is contained in a heat-insulating vessel KC.

The BBO crystal is disposed in the heat-insulating vessel VC and is thermally in contact with a cold finger (CF) cooled by the cooling material CL. The cold finger CF is typically made from a copper material, and is subjected to temperature control by using a heater (HT) additionally provided on the cold finger CF. The cooling material CL, the cold finger CF, and the heater HT constitute a temperature control means 9 for the BBO crystal.

A laser beam outputted from the semiconductor laser enters the heat-insulating vacuum vessel VC through a window (Wi), and passes through the BBO crystal. The wavelength of the laser beam is converted by the BBO crystal. The wavelength-converted laser beam goes out of the vessel VC through a window Wo provided opposite to the window (Wi).

FIG. 3 shows a modification of the temperature control means. As shown in this figure, a cooling apparatus (CC)

(for example, Stirling refrigerator) is additionally provided on the heat-insulating vacuum vessel (VC), wherein the BBO crystal in the heat-insulating vacuum vessel VC is cooled to a specific temperature by the cooling apparatus CC via the cold finger CF. The cooling apparatus CC and the cold finger CF constitute a temperature control means 9A. Even in this case, a laser beam outputted from the semiconductor laser enters the heat-insulating vacuum vessel VC through the window Wi, and passes through the BBO crystal. The wavelength of the laser beam is converted by the BBO crystal. The wavelength-converted laser beam goes out of the vessel VC through the window (Wo) provided opposite to the window Wi.

In each case, by allowing the laser beam 2 outputted from the semiconductor laser 1 to pass through the nonlinear optical crystal 15, an ultraviolet laser beam having a second wavelength shorter than a first wavelength of the laser beam 2 can be generated.

In the embodiment shown in FIG. 1, the external resonator 10 includes an incident mirror 11 through which part of the incident laser beam from the semiconductor laser 1 is led to the nonlinear optical crystal 15 in the resonator 10, a plurality (three pieces in this embodiment) of mirrors 12 to 14, and an optical path length control device (not shown). The control of the optical path length using the optical path length device may be carried out by a manner of mounting a mirror and a prism to a moving means (or driving means) such as a VCM (Voice Coil Motor) or PZT for controlling the positions and postures of the mirror and prism; a manner of applying a control voltage to an electro-optical crystal containing the nonlinear optical crystal 15 to change the optical path length; or a manner of controlling the temperature to change the optical path length. For example, there has been known a control manner in which at least one (mirror 13 in the embodiment shown in FIG. 1) of the optical devices in the external resonator is servo-controlled by the moving means such as the VCM or PZT, to control the length of the resonator in combination with a feedback circuit, thereby retaining a resonance state of the resonator. Alternatively, the control of a transverse mode by providing apertures is also effective.

In the embodiment shown in FIG. 1, the laser beam 2 outputted from the semiconductor laser 1 passes through a phase modulator 3, being reflected from adjusting mirrors 4 and 5, and is led in the external resonator 10 through a mode matching lens 6. The phase modulator 3 is required for an FM side-band locking method (or "Pound-Drever-Hall Locking" method) to be described later. In this case, a modulation signal from an oscillator (not shown) is applied to the phase modulator 3, to modulate the phase of the laser beam 2, and the phase-modulated laser beam 2 enters the external resonator 10 by way of the optical system. It is to be noted that the numbers and arrangements of mirrors, lenses, and the like constituting the optical system may be suitably designed.

Optical detection for the external resonator 10 shown in FIG. 1 is performed as follows: namely, the laser beam having been reflected from the mirror 14 and passed through the mirror 11 reaches a photodetector 8 via a condenser lens 7 used as needed, to be thus received and detected by the photodetector 8. With respect to the photodetector 8, in the case of using a polarization method (or Hänsch-Couillaud method) (for retaining a resonance state of the resonator on the basis of an error signal obtained by, for example, making a laser beam having passed through a waveplate incident on the resonator and calculating a difference between detection signals for two beams different in polarization emerged from the resonator) or using a fringe side method, the photodetector is sufficient to have a band region covering a servo band region of locking. Meanwhile, in the case of using the FM side-band locking method, the photodetector is required to have a band region capable of sufficiently detecting a carrier frequency.

The laser beam emerged from the external resonator 10 passes through a mirror 20, to become a laser beam 22 (for example, non-converted laser beam), or reflected from the mirror 20, to become a reflected laser beam 21 (for example, wavelength-converted laser beam).

Figure 4:
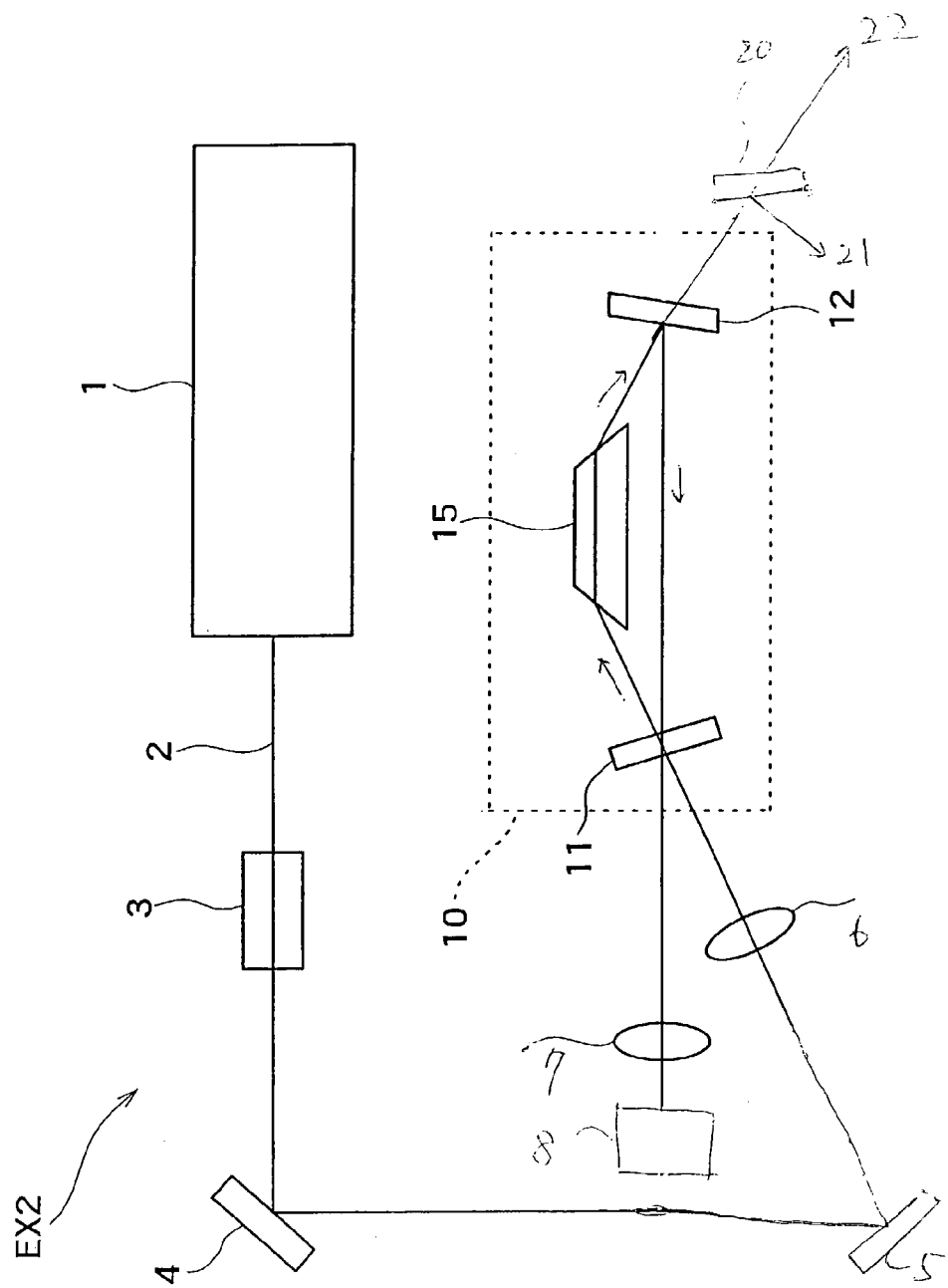
FIG. 4 is a view showing a modification of an external resonator in the apparatus shown in FIG. 1.
Figure 5:
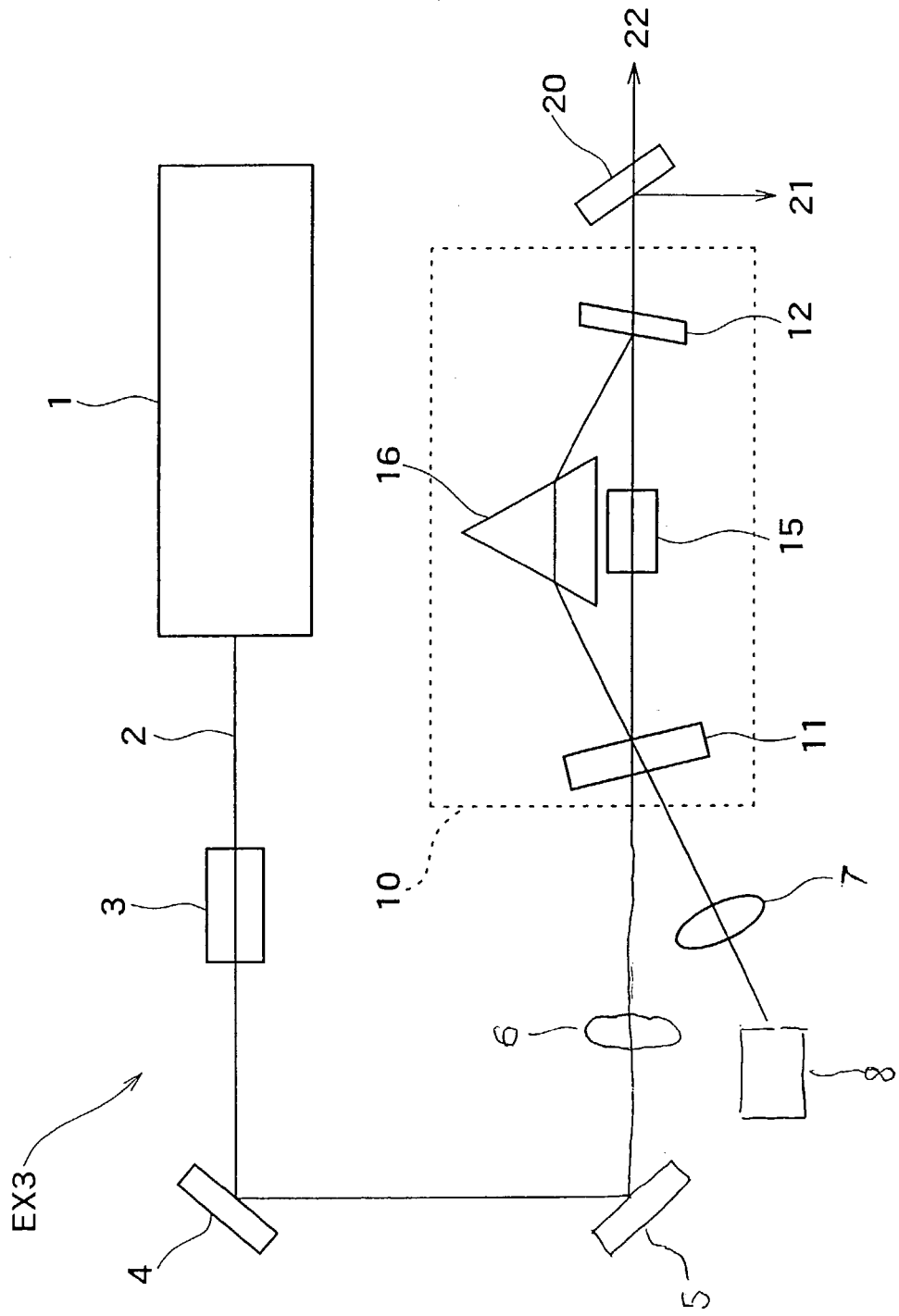
FIG. 5 is a view showing another modification of an external resonator in the apparatus shown in FIG. 1.
Figure 6:
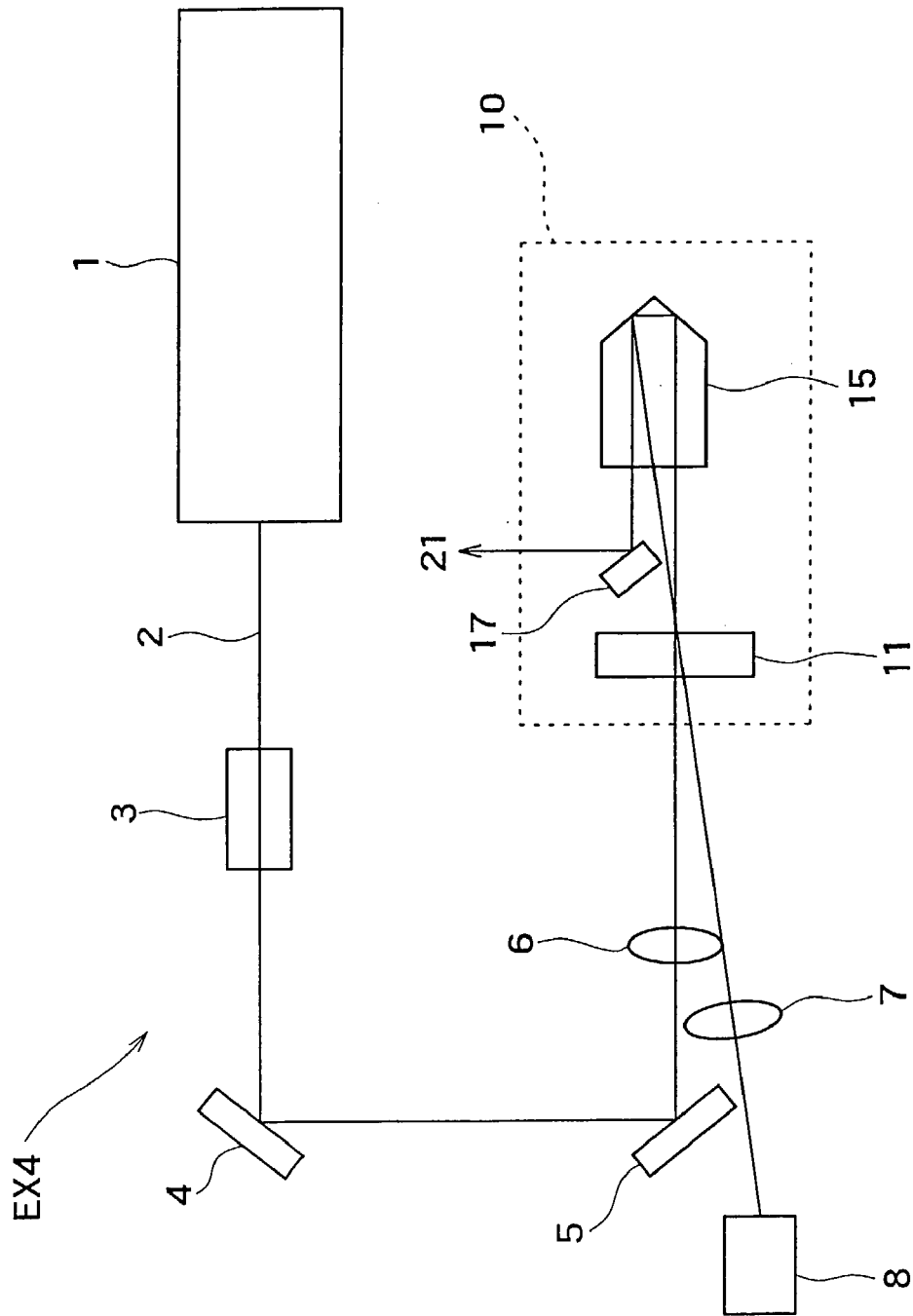
FIG. 6 is a view showing a further modification of the external resonator in the apparatus shown in FIG. 1, in which full-reflection in the nonlinear optical crystal is used.
Figure 7:
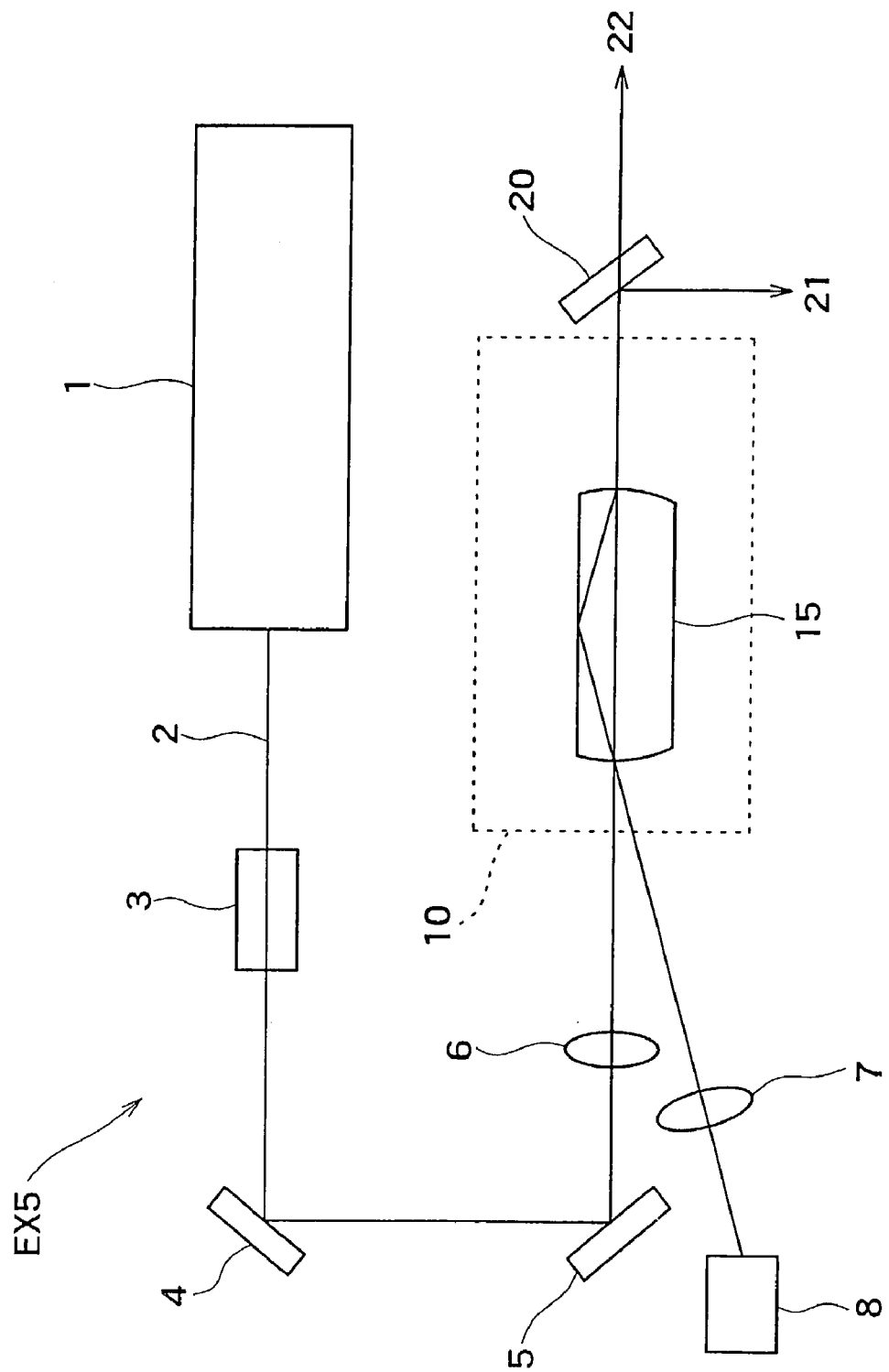
FIG. 7 is a view showing a further modification of the external resonator in the apparatus shown in FIG. 1, in which the external resonator is formed only by the nonlinear optical crystal.

In the embodiment shown in FIG. 1, the four mirrors 11 to 14 are provided in the external resonator 10. The resonator is formed by an optical path through which a laser beam going out of the mirror 11 passes through the nonlinear optical crystal 15, being reflected from the mirrors 12, 13 and 14, and is returned again to the mirror 11. The configuration of the external resonator according to the present invention is not limited to a ring-shaped optical path using the mirrors but may be modified as follows:

(A): modification using two mirrors and making use of refraction at an end face of the nonlinear optical crystal (see FIG. 4);

(B): modification using two mirrors and a prism (see FIG. 5);

(C): modification making use of full-reflection in the nonlinear optical crystal (see FIG. 6); and (D): modification in which the nonlinear optical crystal itself constitutes the external resonator (see FIG. 7)

In the modification (A), as shown in a laser beam generating apparatus EX2 in FIG. 4, a ring-shaped resonator is formed by using mirrors 11 and 12, wherein a nonlinear optical crystal 15 is disposed slightly apart from a main optical path passing through both the mirrors 11 and 12, and the optical crystal 15 is formed into a trapezoidal shape in longitudinal cross-section. In this modification (A) configured as described above, the resonator is formed by an optical path through which a laser beam led from the mirror 11 is refracted from an end face of one end portion of the nonlinear optical crystal 15 and refracted again from an end face of the other end portion of the nonlinear optical crystal 15, and is reflected from the mirror 12, being returned to the mirror 11. The circulating direction of the laser beam may be reversed to that described above with proper modification. That is to say, the resonator may be formed by an optical path through which a laser beam goes out of the mirror 11, being reflected by mirror 12 passing through the nonlinear optical crystal 15, and returns again to the mirror 11.

It is to be noted that a laser beam reflected by the external resonator and passing a condenser lens 7 is received by a photodetector 8.

In the modification (B), as shown by a laser beam generating apparatus EX3 in FIG. 5, the nonlinear optical crystal 15 is disposed between mirrors 11 and 12, and a prism 16 having a triangular cross-section is disposed near a nonlinear optical crystal 15. In this modification (B) configured as described above, the resonator is formed by an optical path through which a laser beam led from the mirror 11 passes through the nonlinear optical crystal 15 and is then reflected from the mirror 12, being refracted from an incident end face of the prism 16 and refracted again from an emergence end face of the prism 16, and is returned again to the mirror 11. Even in this modification, the circulating direction of the laser beam may be reversed to that described above by suitably reversing the incident direction and the positions of the lens 7 and the photodetector 8 to those described above with some required changes in optics. It is to be noted that a laser beam going out of the prism 16 and passing through the mirror 11 and a condenser lens 7 together wit the reflected beam from mirror 11 are received by a photodetector 8.

In the modification (C), as shown in a laser beam generating apparatus EX4 in FIG. 6, mirrors 11 and 17 and a nonlinear optical crystal 15 are disposed in an external resonator 10 and the nonlinear optical crystal 15 is formed into a pentagonal shape, for example, in longitudinal cross-section (an angle of an acute portion is slightly smaller than 90°). In the modification (C) configured as described above, the resonator is formed by an optical path through which a laser beam led from the mirror 11 is made incident on the nonlinear optical crystal 15, being emerged from the optical crystal 15 after double total-internal-reflection in the optical crystal 15, and is returned again to the mirror 11. Further, a laser beam (second harmonic) emerged from the total-internal-reflection plane of the nonlinear optical crystal 15 to the mirror 17 and reflected from the mirror 17 is taken as an output laser beam 21. It is to be noted that a laser beam going out of the nonlinear optical crystal 15 and passing through the mirror 11 and a condenser lens 7 together with the reflected beam from mirror 11 are received by a photodetector 8.

In the modification (D), as shown by a laser beam generating apparatus EX5 in FIG. 7, a nonlinear optical crystal forms a resonator without use of any external mirrors, wherein the optical crystal has a vertical cross-section formed by removing part of a spherical plane. In this modification (D) configured as described above, the resonator is formed by an optical path through which a laser beam is made directly incident on a nonlinear optical crystal 15 through the input coupling mirror coating, being reflected by mirror coating on an emergence end face of the optical crystal 15 and total-interal-reflection from a side plane of the optical crystal 15, and is returned to the incident end face of the optical crystal 15. The laser beam going out of the nonlinear optical crystal 15 and passing through the condenser lens 7 together with the reflected beam from mirror surface of the crystal received by a photodetector 8. In this modification, since any optical device such as external mirrors is not used, a mechanically driving means for retaining a resonance state of the resonator is present; however, for example, in the case of forming an external resonator only by a barium borate crystal, the resonance state can be kept by providing a temperature control means for the crystal or applying a voltage thereto thereby changing an optical characteristic of the crystal.

The above-described modifications (A) to (D) are for illustrative purposes only, and therefore, in these modifications, the number and arrangement of mirrors may be changed or a grating or prism be used as a resonance constituting element other than the mirror. It is to be noted that in each of laser beam generating apparatuses EX2 to EX5 respectively including the modifications (A) to (D), the components other than the external resonator and their arrangements are the same as those in the laser beam generating apparatus EX1 shown in FIG. 1, and therefore, the same reference numerals are given to the same parts and the overlapped description thereof is omitted.

The operation, function, and effect of the above-described external resonator will be described by example of the configuration shown in FIG. 1.

It is now assumed that a reflectance of the mirror 11 is taken as R1, and a synthetic reflectance of the other mirrors 12 to 14 multiplied by the transmission of nonlinear optical crystal 15 is taken as Rm. On this assumption, when a laser beam enters the external resonator 10 through the mirror 11 under a condition that the optical path is desirably adjusted, a reflectance $R(\delta)$ of the entire resonator 10, which is detected by the photodetector 8 (for example, a photodiode), is given by the following equation:

$$R(\delta) = \frac{\left(\sqrt{R_1} - \sqrt{R_m}\right)^2 + 4\sqrt{R_1 R_m}\sin^2\frac{\delta}{2}}{\left(1 - \sqrt{R_1 R_m}\right)^2 + 4\sqrt{R_1 R_m}\sin^2\frac{\delta}{2}} \quad (1)$$

In the above equation, $\delta = 2\pi \cdot L/\lambda$ where $\lambda$ is a wavelength of the semiconductor laser 1 as the light source, and L is a length of the round-trip optical path of the resonator 10.

Figure 8:
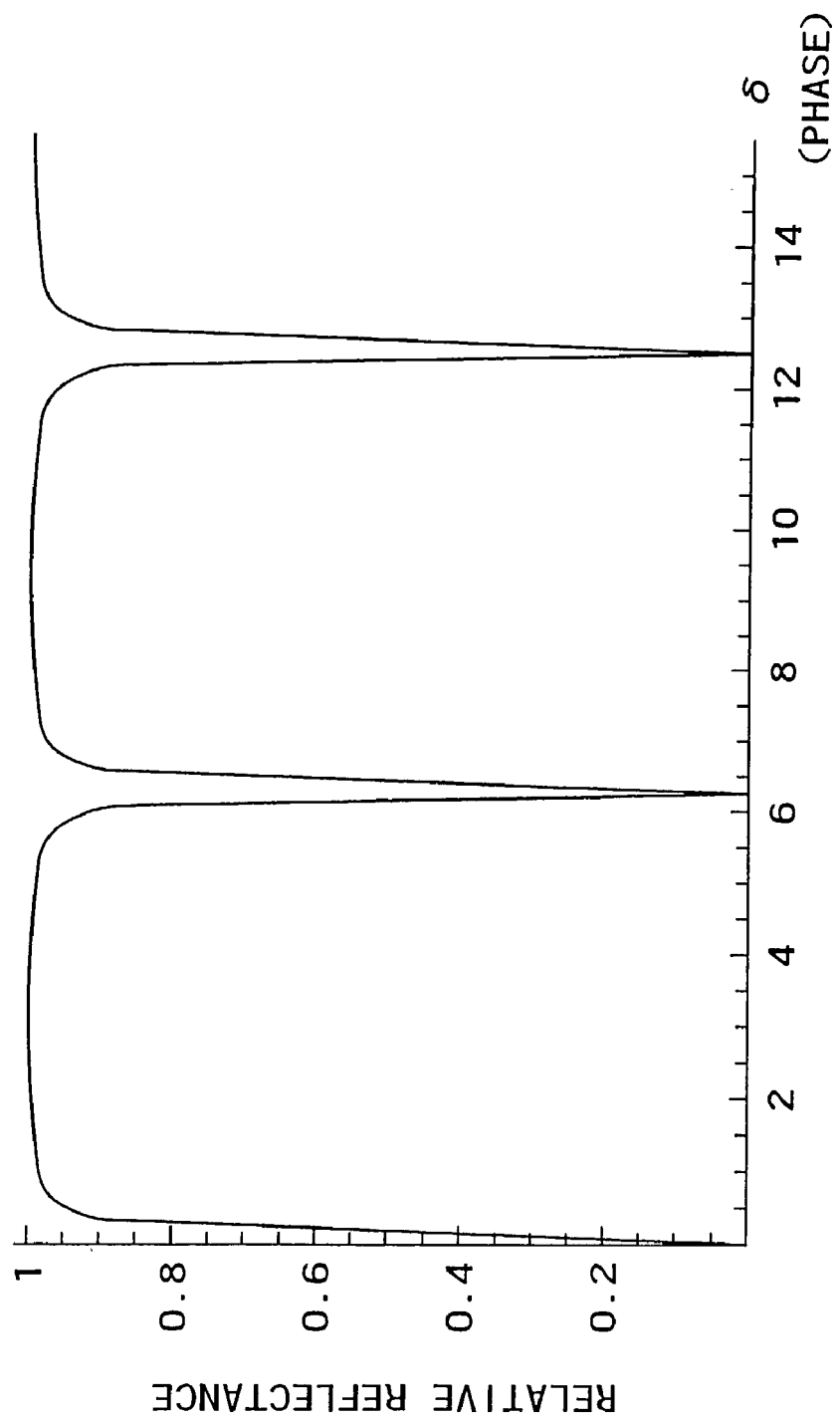
FIG. 8 is a graph showing a δ dependence of a relative reflectance.

FIG. 8 is a graph showing a reflection characteristic ($\delta$ dependence of a relative reflectance) in accordance with the above equation, in which $\delta$ is indicated on the abscissa and the relative reflectance (0 to 1) is indicated on the ordinate. It is to be noted that in the graph, for an easier visual understanding, R1 and Rm are each set to 0.90 and the finess is set to be lower than the actual finess.

As is apparent from the fact that a term of the square of a sine function $\sin(\delta/2)$ is contained in the equation (1), when $\delta = p \cdot \pi$ (p: even number), the apparent reflectance of the resonator 10 is lowered, so that the intensity of the incident laser beam circulating in the resonator becomes large. Such a state is called a "resonance state" and retention of the resonance state is called "locking".

Figure 9:
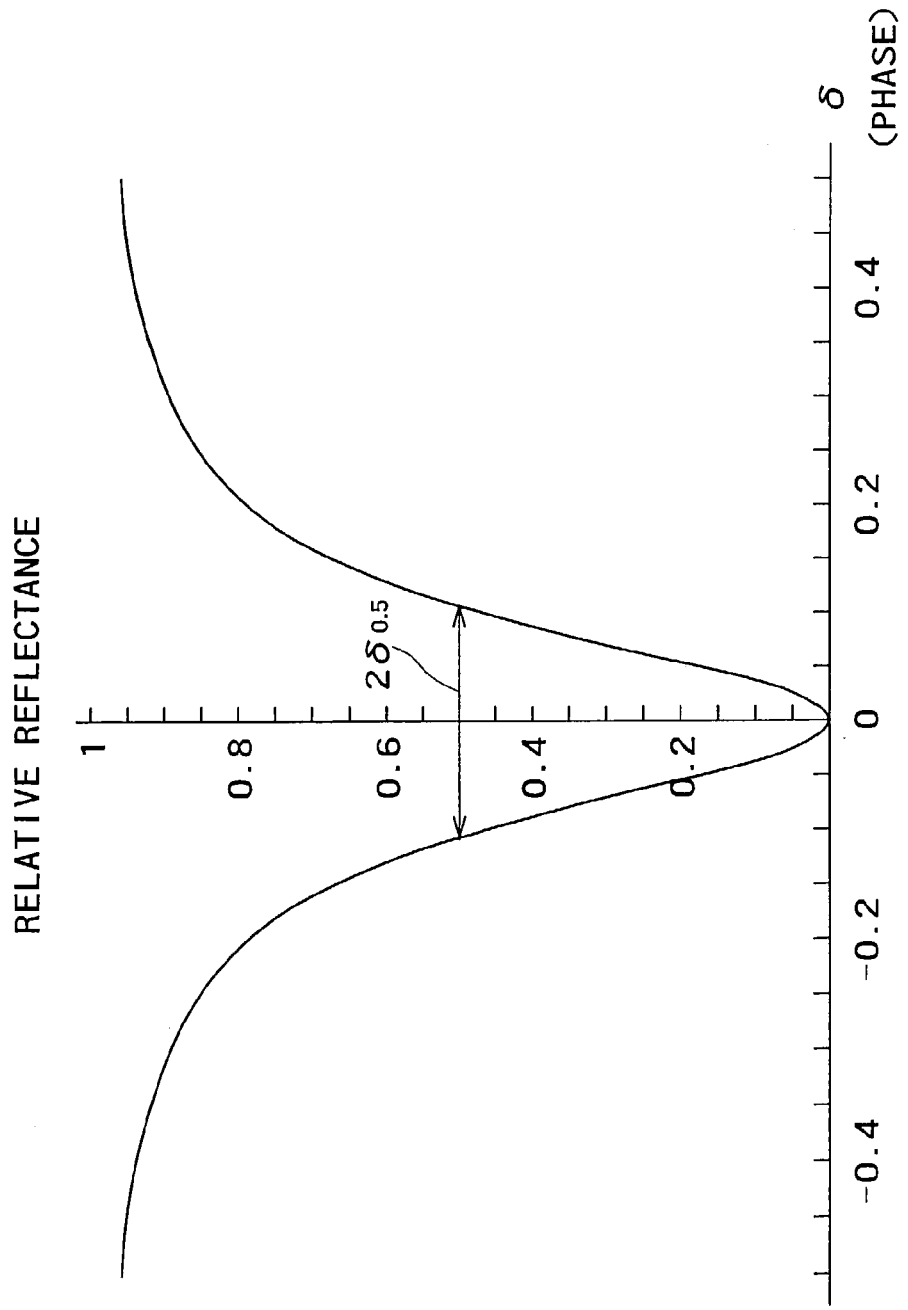
FIG. 9 is a graph enlargedly showing an essential portion of a δ dependence of a relative reflectance in FIG. 8.

In FIG. 8, the leading end of a downward peak (bottom) is equivalent to the resonance state, and the limit capable of retaining the resonance state can be expressed with a full width at half maximum of an allowable frequency taken as an index. Specifically, the full width at half maximum of an allowable frequency (expressed by doubling a half width $\delta_{0.5}$, that is, $2\delta_{0.5}$) is obtained as follows: namely, as shown in FIG. 9, in the case of changing the optical path length L of the resonator 10, that is, changing $\delta$ proportional to the optical path length L, $2\delta_{0.5}$ is obtained as a value of $\delta$ at a point where a changed amount of the apparent reflectance of the resonator becomes half of the peak value of the apparent reflectance ($\delta$=for example, 0, $2\pi$). This is expressed by the following equation:

$$2\delta_{0.5} = \frac{2\left(1 - \sqrt{R_1 R_m}\right)}{(R_1 R_m)^{\frac{1}{4}}} \quad (2)$$

Figure 10:
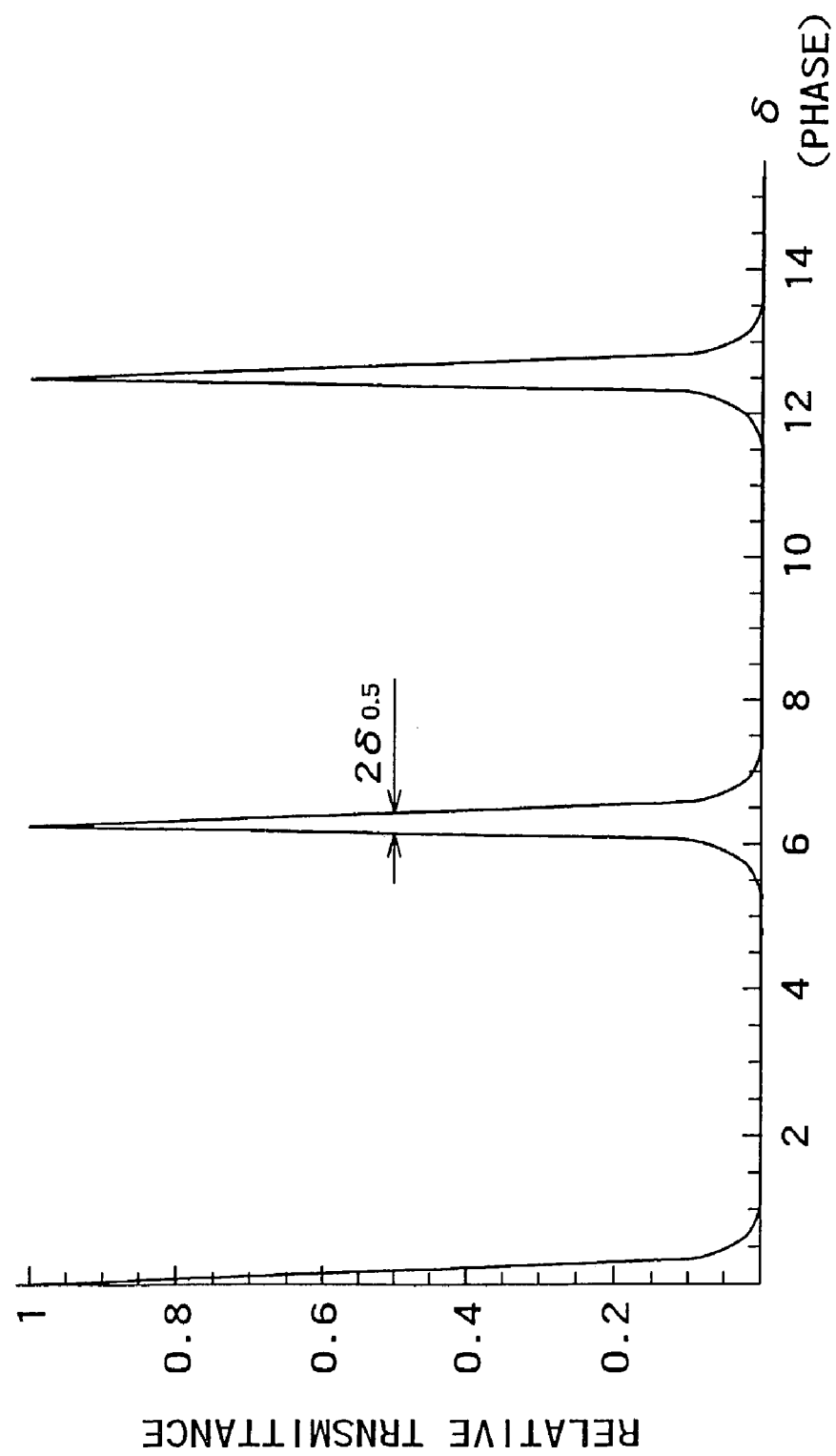
FIG. 10 is a graph showing a δ dependence of a relative transmittance.

It is to be noted that $2\delta_{0.5}$ may be obtained as a value of $\delta$ at a point where a changed amount of an apparent transmittance of the resonator becomes half of the peak value of the apparent transmittance (see FIG. 10).

The limit capable of retaining the resonance state can be expressed by an equation about a frequency. To be more specific, a frequency width $\Delta f$ (unit: Hz) is expressed by the following equation, which equation is obtained by multiplying the right side of the equation (2) by FSR/$2\pi$. FSR is an abbreviation of "Free Spectral Range" and is expressed by C/L where C is a light velocity and L is a round-trip length of the resonator.

$$\Delta f = \frac{FSR \cdot \left(1 - \sqrt{R_1 R_m}\right)}{\pi (R_1 R_m)^{\frac{1}{4}}} \quad (3)$$

The external resonator 10 provided for the semiconductor laser 1 is used for confining an incident laser beam for increasing a circulating power of the laser beam, thereby enhancing a wavelength-conversion efficiency. Accordingly, it is required to efficiently lead an incident laser beam in the resonator 10.

To meet such a requirement, it is required to take into account the following items (I) to (III):

(I) to make spatial superposition of beams desirable (mode matching);

(II) to keep a phase relationship between a circulating laser beam and incident laser beam for retaining resonance state (locking); and (III): to take good balance between leakage of circulating laser beam and amplitude of reflection of incident laser beam for making apparent reflectance in resonance state as small as possible (impedance matching).

To realize the mode matching in the item (I), it is required to suitably adjust and set an incident angle and an incident position of a laser beam on the external resonator, and a beam radius and a curvature of a wave plane of the laser beam. In the apparatus shown in FIG. 1, it is important to set the laser beam 2 such that the incident beam is nearly aligned to a resonance beam on the incident mirror 11 in the external resonator 10 by adjusting the direction (upward angle) of the laser beam 2 and the position of the laser beam in the vertical direction with respect to the optical axis with the use of the mirrors 4 and 5 and also by adjusting the beam radius and the curvature of the wave plane of the laser beam with the use of the optical system including the lens 6. Of course, this is based on the assumption that the external resonator 10 is configured as a stable resonator; however, the combination of the mirrors and lenses can be variously changed insofar as the condition that the incident laser beam is nearly aligned to the resonance laser beam on the incident mirror 11 is established.

To realize the locking in the item (II), as is apparent from the expression of $\delta=2\pi L/\lambda$, either or both of the circulating optical path length L and the wavelength $\lambda$ may be controlled. To be more specific, the resonance state can be retained by controlling either or both of the circulating optical path length L and the wavelength $\lambda$ of the incident laser beam such that the circulating optical path length L becomes q times the wavelength $\lambda$, where q is a natural number variable. That is to say, an expression of $L=q\cdot\lambda$ is obtained from the expression of $\delta=2\pi\cdot L/\lambda=2\pi\cdot q$.

The circulating optical path length L is varied rapidly for a longer period by the flow of a gas filling the external resonator, the temperature change in medium passing through the external resonator, and the vibration and deformation of the mechanism for supporting the mirror and the temperature change in the mechanism for supporting the mirror. Meanwhile, the wavelength $\lambda$ of the laser beam outputted from the light source is varied by temperature fluctuation, vibration, expansion, and disturbance (for example, current noise). Accordingly, to retain the resonance state in which the circulating optical path length L becomes q times the wavelength $\lambda$ of the incident laser beam (q: natural number), for example, there may be adopted one of the following control manners:

(1) to variably control the wavelength $\lambda$; and (2) to variably control the circulating optical path length L.

The control manner (1) for variably controlling the wavelength $\lambda$ may be carried out by changing the temperature of the semiconductor laser 1 or a current applied to the semiconductor laser 1, or by giving a strain to the laser crystal by PZT or the like.

The control manner (2) for variably controlling the circulating optical path length L may be carried out by mounting an optical device such as a mirror to a PZT or VCM and mechanically controlling such an optical device, or controlling an optical characteristic (for example, refractive index) of a crystal containing the nonlinear optical crystal or an optical device by giving a voltage or strain to the crystal or optical device or controlling the temperature of the crystal or optical device.

The control manners (1) and (2) may be combined with each other.

Of these control manners, a suitable one may be selected in consideration of control responsiveness, stability, and the like.

The retention of the resonance state requires, as described above, a means for variably controlling the circulating optical path length L and/or the wavelength $\lambda$ of a laser beam, and further requires a means (for example, a control circuit) for usually changing the circulating optical path length L and/or the wavelength $\lambda$ of a laser beam depending on the disturbance so as to keep the above-described relationship of $L=q\cdot\lambda$. In addition, there have been proposed various methods of generating an error signal required for the control of retaining the resonance state, for example, a fringe side locking method, an FM side band locking method, and a polarization locking method (see "T. W. Hansh, and B. Couillaud, Optics Communications, Vol. 35, No. 3, P.441 (1980)").

Of these methods, the FM side band locking method is less affected by noise and is taken as a stable resonator locking method. The outline of the FM side band locking method will be described with reference to FIG. 11.

Figure 11:
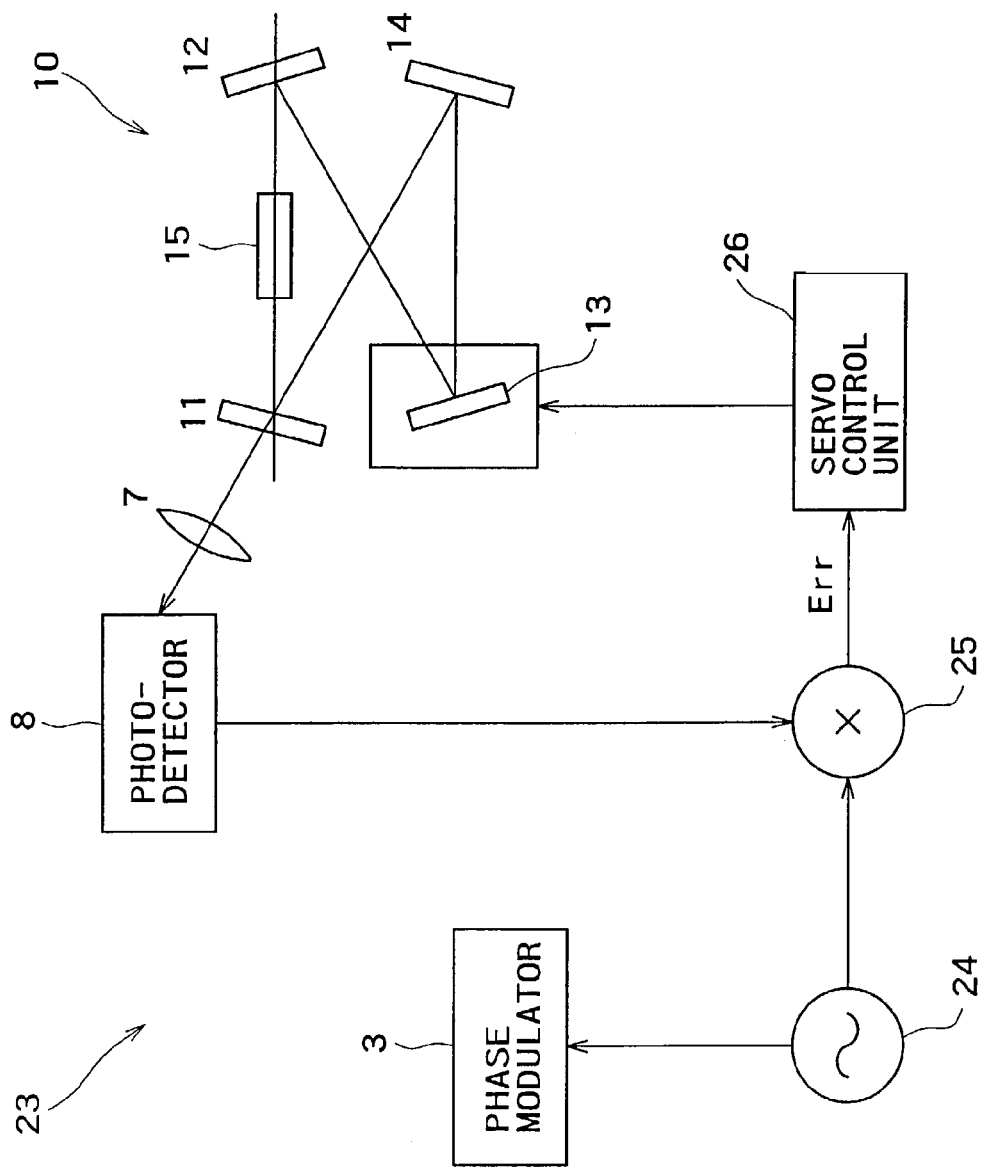
FIG. 11 is a diagram illustrating a control system including a phase modulator and a photodetector.

Referring to FIG. 11, there is shown a control means 23 including a phase modulator 3 and a photodetector 8. A modulation signal having a specific frequency is generated by a signal generating portion 24 including a local resonator (shown by a symbol indicating a signal source). The signal is applied to the phase modulator 3, whereby a laser beam from the semiconductor laser 1 is subjected to phase modulation.

A detection signal from the photodetector 8 and the above modulation signal are fed to a detecting portion 25 (shown as a multiplier in the figure) to be subjected to synchronous detection by the detecting portion 25. An error signal, denoted by character Err, obtained by the synchronous detection is fed to a servo control portion 26.

The servo control portion 26 generates a control signal such that the level of the error signal becomes zero, and controls the circulating optical path length L of the resonator on the basis of the control signal. For example, with respect to the external resonator 10 shown in FIG. 1, the position and posture of the mirror 13 are controlled. Since a mirror moving mechanism, a mirror drive control circuit, and a circuit required for signal processing (for example, a filter required to fetch a high frequency signal from the received detection signal) are already known, and therefore, the illustration thereof is omitted.

As another method of realizing the locking by controlling the drive of the means for adjusting the optical length, there has been known a method of performing the locking by giving a voltage or strain to the nonlinear optical crystal 15 placed in the external resonator 10 or modulating the light source itself (see "W. Kozlovski and others, IEEE Journal of Quantum Electronics, Vol. 24, No. 6, P.913 (1988)").

It is to be noted that in the FM side band method, an electro-optical crystal having a transmittance against the wavelength λ of a laser beam, such as KTP or BBO is used for the phase modulator 3, wherein a side band is generated by applying a high frequency voltage to the crystal.

The modulation frequency differs between the method of detecting a reflected laser beam from the resonator and the method of detecting a transmission laser beam through the resonator. From the viewpoint of the magnitude of the detection signal, the former method is superior to the latter method.

Assuming that a value obtained by diving FSR (=C/L) of the external resonator by a finess F of the resonator is taken as a transmission width of the resonator, such a transmission width of the resonator is equal to Δf defined by the equation (3).

In the method of detecting an error signal from a reflected beam, for example, in FIG. 1, a reflected beam from the incident mirror 11 is received by the photodetector 8 via the optical system such as the condenser lens 7, and a detection signal from the photodetector 8 and a signal (having the same frequency as the modulation frequency) from the local oscillator are subjected to synchronous detection, to generate an error signal. In this case, the modulation frequency is desirable to be sufficiently larger than Δf. This is because, in the vicinity of the resonance state, a side band is efficiently reflected in the external resonator to reach the photodetector. If the modulation frequency is smaller than Δf, the rate of a transmission component becomes large.

Meanwhile, in the method of detecting an error signal from a transmission beam, for example, in FIG. 1, a transmission beam through the mirror 12 is received by a photodetector (not shown), and a detection signal from the photodetector and a signal from the local oscillator are subjected to synchronous detection, to generate an error signal, although the magnitude of the signal is small. In this case, unlike the method of detecting an error signal from a reflected beam, the modulation frequency is desirable to be smaller than Δf.

Figure 12:
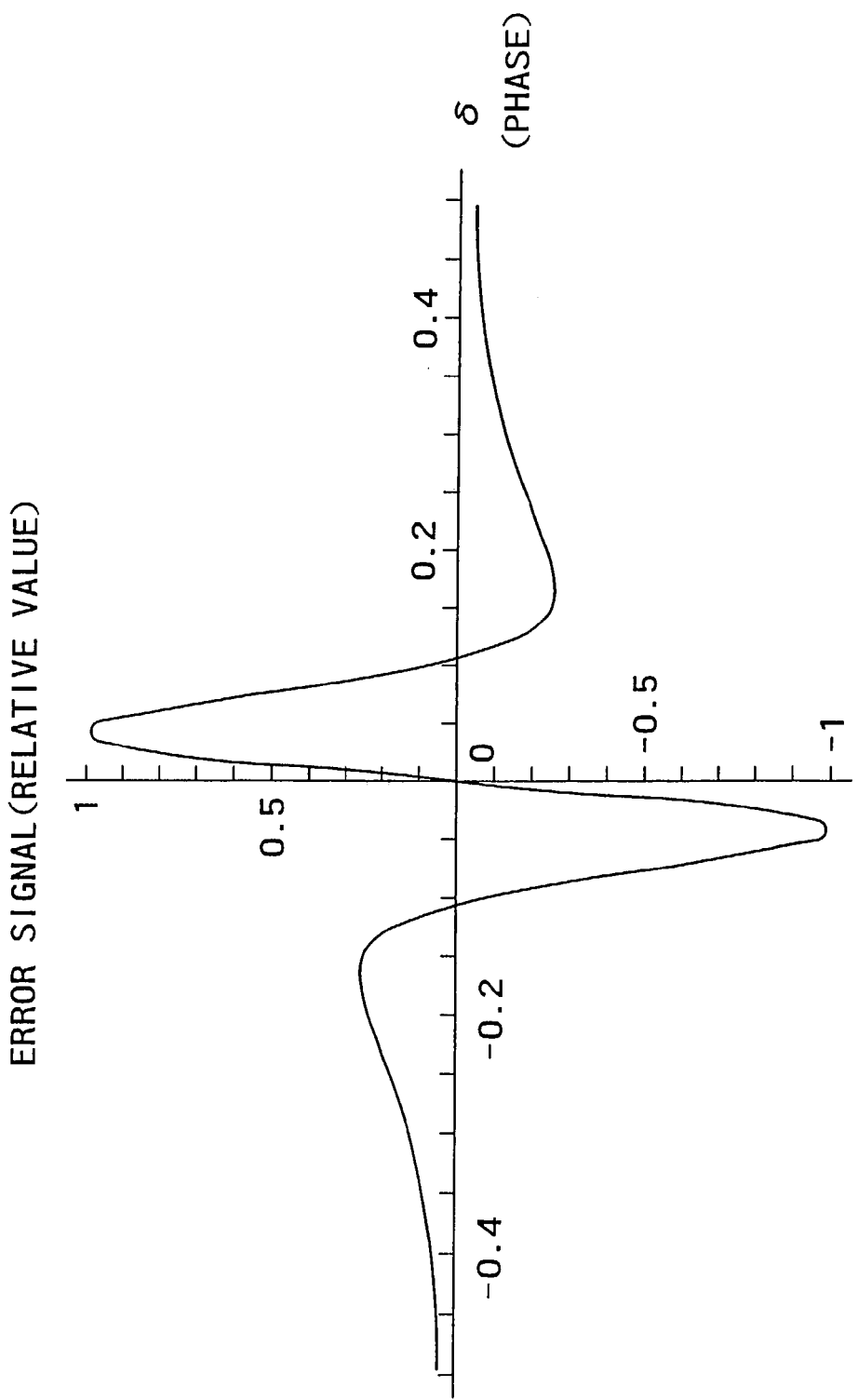
FIG. 12 is a graph showing a δ dependence of an error signal.

FIG. 12 enlargedly shows one example of the δ dependence of an error signal (Err) generated on the basis of an optical detection signal and a modulation signal, wherein δ is indicated on the abscissa and a signal value (relative value) is indicated on the ordinate.

For example, in the case of using the method of detecting an error signal from a reflected beam, the error signal Err is obtained on the basis of a balance between signals of both reflected side bands when the resonance frequency of the resonator comes close to the vicinity of the frequency of a laser beam, and indicates the magnitude and direction of a deviation of δ from the resonance position (δ=0). To be more specific, on the right side of FIG. 12, as the value of δ goes ahead in the normal direction, the error signal Err is raised to a positive peak value and is rapidly dropped to a bottom value, and is then made asymptotic to the δ axis, and on the left side of FIG. 12, as the value of δ goes ahead in the negative direction, the error signal Err is dropped to a bottom value and is rapidly raised to a peak value, and is then made asymptotic to the δ axis. In this way, since the curve nearly has a rotation symmetry of 180° around the origin of δ=0, the magnitude and direction of a deviation of δ from the resonance position (δ=0) can be determined on the basis of the error signal.

Accordingly, the resonance state can be retained by providing a negative feedback system for correcting a position of a component such as a mirror of the resonator and controlling the optical path length of the resonator such that the error becomes zero. In addition, by containing a side band component in a reflected beam as mush as possible, the amplitude of the error signal becomes large, with a result that a signal-to-noise (S/N) ratio can be generally made large.

To realize the impedance matching in the item (III), the reflectance of each mirror may be selected such that Rm becomes equal to R1 in the equation (1). In this case, the conversion of the circulating fundamental harmonic to a higher harmonic (second harmonic) due to wavelength-conversion by the nonlinear optical crystal must be taken into account in calculation of Rm (see "W. Kozlovski and others, IEEE Journal of Quantum Electronics, Vol. 24, No. 6, P.913 (1988)"). In actual, it is difficult to keep the state of impedance matching for a long period, due to variations in bulk transmittance of an optical device such as a wavelength-conversion crystal, coating transmittance (reflectance), and mirror reflectance, or deterioration with age; however, for example, by setting the value of R1 to be slightly smaller than Rm, it is possible to suppress a reduction in power of the circulating fundamental harmonic even if a loss is increased by deterioration with age, and hence to suppress a reduction in power in generation of a higher harmonic.

By realizing the mode matching in the item (I), the locking in the item (II), and the impedance matching in the item (III), it is possible to enhance the wavelength-conversion efficiency and to stably retain the resonance state.

An embodiment in which BBO is used as the nonlinear optical crystal will be hereinafter described in detail.

With respect to the method of forming the BBO crystal by crystal growth, a flux method and a direct growth method (Czochralski method) have been known. The flux method is carried out by adding an additive called "flux" to molten barium borate to lower a temperature of the molten barium borate by depression of a solidifying point, and growing a β-phase. The method, however, has a problem that since the flux is easy to remain in the BBO crystal after growth thereof and hence to cause point defects, scattering and absorption of light from the BBO crystal becomes large. On the other hand, the direct growth method is advantageous in that since the growth rate is large and any flux is not used, inclusions less remain in the BBO crystal and thereby scattering of light therefrom is small. As a result, in the case of keeping a loss at a very small level as an external resonator, the BBO crystal produced by the direct growth method is superior to that produced by the flux method.

In the BBO allowing phase matching under a condition of Type 1, since the shortest wavelength of an incident light capable of generating a second harmonic is 410 nm or slightly less, the wavelength of the generated light becomes 205 nm or slightly less (see "Kato, Laser Research, Vol. 18, P.3 (1990)"). In this case, since the phase matching is NCPM (Non Critical Phase Matching) in which the fundamental harmonic is made incident in a direction perpendicular to the c-axis of the crystal (phase matching angle θ=90°) or nearly perpendicular to the c-axis of the crystal, it is possible to obtain advantages associated with the longer interaction length and no deformation of the beam due to walk off. By making the crystal length longer (for example, 10 mm or more), it is possible to enhance the wavelength-conversion efficiency. In particular, as described in "G. D. Boyd and others, Journal of Applied Physics, Vol. 39, No. 8, p.3597 (1968)", the wavelength-conversion efficiency is maximized when the following equation is established between a crystal length L and a confocal parameter "b" that is a function of a spot radius "w" when light is condensed in the crystal, which spot radius "w" is determined as the radius of a spot having an intensity of $e^{-2}$ ("e" is a base of a natural logarithm) on the assumption that the peak of a beam intensity is taken as 1.

$$\xi = \frac{L}{b} = 2.84, \text{ where } b = \frac{2\pi n}{\lambda} w^2 \qquad (4)$$

In the focal parameter $[b=k \cdot w^2=(2\pi n/\lambda) \cdot w^2]$, n is a refractive index of the fundamental harmonic, and $\lambda$ is a wavelength of the fundamental harmonic.

Figure 13:
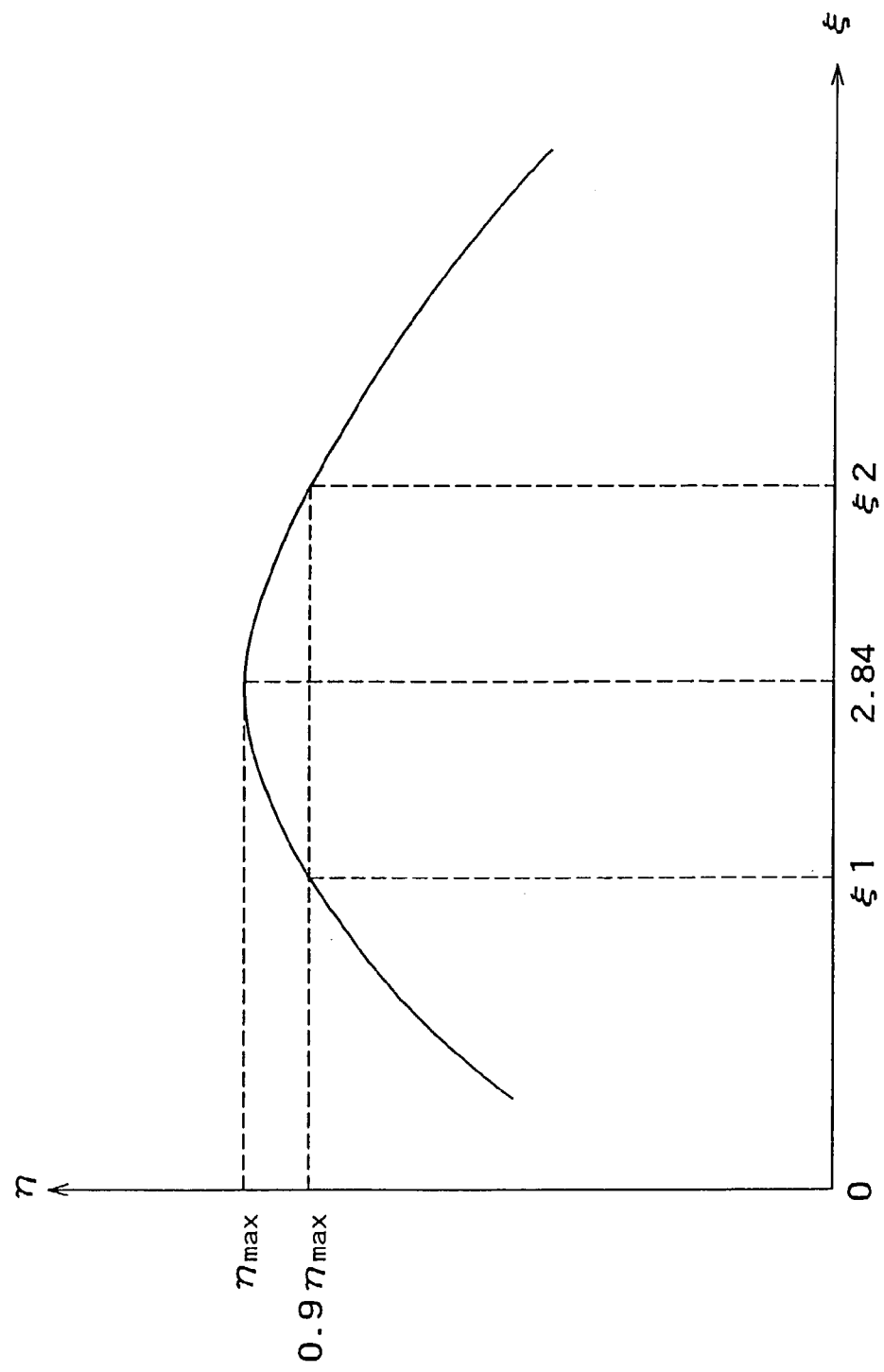
FIG. 13 is a schematic graph illustrating the efficiency.

FIG. 13 is a graph showing a relationship between a parameter $\xi(=L/b)$ and a wavelength-conversion efficiency $\eta$ in the case where the walk off is zero, wherein the parameter $\xi$ is indicated on the abscissa and the efficiency $\eta$ is indicated on the ordinate. As shown in FIG. 13, the maximum efficiency is obtained when the parameter $\xi$ is about 2.84.

The efficiency at L/b of about 2.84 is most desirable; however, from the practical viewpoint, the efficiency at L/b in a near region of 2.84 (in a region within −5% of 2.84 or a region within −10% of 2.84) may be usable. For example, to set the efficiency $\eta$ in a region within about −10% of the maximum value $\eta_{max}$, that is, in a region of $0.9 \cdot \eta_{max}$, from the calculation based on the above-described document, the spot radius "w" is required to be limited to a value within ±40% of the spot radius ($\approx \sqrt{(L/(2.84 k))}$) obtained from the equation 4 (see a range from $\xi 1$ to $\xi 2$ in the figure). Insofar as the spot radius "w" is in the above range, there is less problem associated with a reduction in efficiency. For the BBO crystal, as a result of substituting numerical values, for example, in the wavelength and refractive index, it becomes apparent that, on the assumption that L is set to 10 mm or more, the spot radius "w" is desirable to be within ±40% of $10\sqrt{(L)}$ μm (the unit of L: mm).

An effective nonlinear constant or effective nonlinear optical constant (which is denoted by "$d_{eff}$") of the BBO crystal allowing phase matching under a condition of Type 1 is expressed by the following equation containing a term of an effective nonlinear constant $d_{31}$ and a term of an effective nonlinear constant $d_{22}$, wherein it is assumed that a phase matching angle (angle between the +C-axis direction of the nonlinear optical crystal and the direction of a light ray) is taken as $\theta$ and a walk off is taken as $\rho$.

$d_{eff}=d_{31} \sin(\theta+\rho)-d_{22} \cos(\theta+\rho)(0° \leq \theta \leq 90°)$ or $|d_{eff}|=|d_{31} \sin(\theta+\rho)+(-d_{22} \cos(\theta+\rho))|(0° \leq \theta \leq 90°)$ \qquad (5a)

$d_{eff}=d_{31} \sin(\theta-\rho)-d_{22} \cos(\theta-\rho)(90°<\theta<180°)$ \qquad (5b)

In the case of NCPM, by substituting $\theta=90°$ and $\rho=0°$ in the above equations, $d_{eff}$ becomes $d_{31}$.

According to documents, for example, "Shouji, Doctoral Dissertation, Physical Engineering Department of The University of Tokyo (1998)", and "Handbook of Nonlinear Optical Crystals, Dmitriev and others, 3rd Edition, Springer Verlag (1999)", the magnitude of $d_{31}$ is 0.018 times the magnitude of $d_{22}$. For example, on the basis of a Miller's rule, if the magnitude of $d_{22}$ is taken as $3.0 \times 10^{-12}$ m/V, the magnitude of $d_{31}$ becomes $4.5 \times 10^{-14}$ m/V. As a result, even by using the advantageous conversion of NCPM having a characteristic of retaining the shape of a wavelength-converted beam, since the output is nearly proportional to the square of $d_{eff}(=d_{31})$, the conversion efficiency becomes low.

For example, even if an enhancement factor of the external resonator is taken as 200 (equivalent to a finess of about 600), in order to obtain an output of 1 mW usually required from the practical viewpoint, an average incident power of 100 mW or more at a wavelength of 409.5 nm is required as the output of the laser light source 1. As one example, in the case where a laser beam outputted from a laser light source of 120 mW to an external resonator of a finess of about 200 with a coupling efficiency of 80% (including mode matching and impedance matching), the output amplified in the external resonator becomes about 0.7 mW.

On the other hand, the above conversion efficiency causes an inconvenience that a load applied to the laser light source becomes large. Therefore, it is required to improve the efficiency for using the laser light source as an inexpensive light source.

As is apparent from the equation (5-a), since the first term on the right side is $(d_{31} \cdot \sin(\theta+\rho))$ and the second term on the right side is $(-d_{22} \cdot \cos(\theta+\rho))$, if signs of both the first and second terms are different from each other, the effective nonlinear constant $d_{eff}$ is calculated by subtracting one of the first and second terms from the other. As a result, the absolute value of the effective nonlinear constant $d_{eff}$ is smaller than the absolute value of the larger term. On the other hand, if both the first and second terms are in a relationship that one of the terms is added to the other (that is, if signs of both the first and second terms are identical to each other), the absolute value of the effective nonlinear constant $d_{eff}$ becomes large, to increase the output, thereby enhancing the conversion efficiency. The same is true for the equation (5-b).

Figure 14:
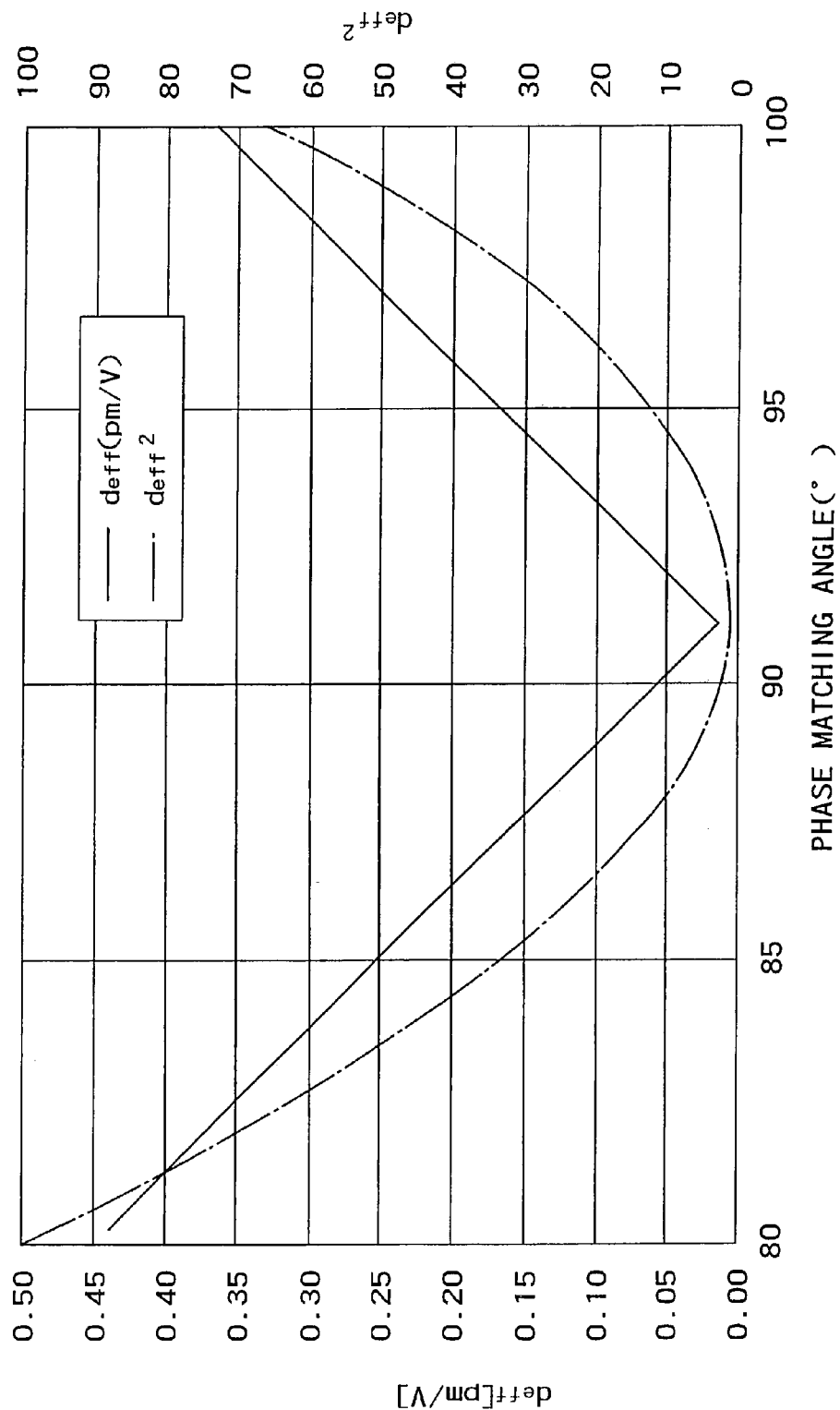
FIG. 14 is a graph showing a relationship between a phase matching angle θ and each of the value of an effective nonlinear constant and the square thereof.

FIG. 14 is a graph showing a relationship between a phase matching angle $\theta$ and each of an effective nonlinear constant $d_{eff}$ (unit: pm/V, where p indicates pico $(10^{-12})$ and the square of the effective nonlinear constant $d_{eff}$, wherein the phase matching angle $\theta$ is indicated on the abscissa, and the magnitude (absolute value) of the constant $d_{eff}$ and the square value $d_{eff}^2$ are indicated on both sides on the ordinate. In addition, the square value $d_{eff}^2$ is expressed as a relative value with the square value $d_{eff}^2$ under NCPM ($\theta$: 90°,$\rho$: 0) taken as 100. In the figure, the graph shown by a solid line indicates the absolute value of the constant $d_{eff}$, and the graph shown by a broken line indicates the square value $d_{eff}^2$. In the figure, in a range of $\theta<90°$, since one of the first and the second terms is added to the other, the absolute value of the constant $d_{eff}$ becomes larger than the constant $d_{eff}$ under NCPM, and in a range of $\theta>$ about 91°☐one of the first and second terms is subtracted from the other, and even in this case, the absolute value of the constant $d_{eff}$ becomes larger than the constant $d_{eff}$ under NCPM. If the loss of the fundamental harmonic by wavelength-conversion is as small as being negligible as compared with the loss of the resonator, the output of the second harmonic by the BBO crystal is proportional to the square of the constant $d_{eff}$, with respect to the minimum value of the constant $d_{eff}$, even if the angle $\theta$ is decreased or increased, the magnitude of the constant $d_{eff}$ is gradually increased. In this case, the degree of increasing the constant $d_{eff}$ in the range of $\theta<90°$ (both the terms are added to each other) is larger than that in the range of $\theta>$ about 91°. The signs of the constants $d_{22}$ and $d_{31}$ are set to be different from each other in the above description, and in the case where the signs thereof are identical to each other, the above-described adding (or subtracting) relationship for the first and second terms is reversed to that described above.

A relationship between a phase matching angle variable in a range of 90°± about 10 and each of an effective nonlinear constant and a square thereof, a specific effective nonlinear constant ($d_{22}$, $d_{31}$), a walk off, and a wavelength and a refractive index of a fundamental harmonic being in phase matching, is shown in Table 1.

TABLE 1

| phase matching angle (°) | $d_{eff}$ (pm/v) | $d_{eff}^2$ (relative value) | $d_{22}$ (pm/v) | $d_{31}$ (pm/v) | Walk off (°) |
|---|---|---|---|---|---|
| 100.3 | 0.38 | 69 | 3.03 | 0.045 | 2.29 |
| 99.7 | 0.35 | 60 | 3.03 | 0.045 | 2.18 |
| 99.1 | 0.33 | 52 | 3.03 | 0.046 | 2.05 |
| 98.4 | 0.30 | 43 | 3.03 | 0.045 | 1.91 |
| 97.7 | 0.27 | 35 | 3.04 | 0.045 | 1.75 |
| 96.9 | 0.24 | 27 | 3.04 | 0.045 | 1.57 |
| 96.0 | 0.20 | 19 | 3.04 | 0.045 | 1.37 |
| 94.9 | 0.15 | 12 | 3.04 | 0.045 | 1.13 |
| 93.4 | 0.093 | 4 | 3.04 | 0.045 | 0.8 |
| 92.0 | 0.061 | 2 | 3.05 | 0.045 | 0 |
| 91.0 | 0.008 | 0 | 3.05 | 0.045 | 0 |
| 90.0 | 0.045 | 1 | 3.05 | 0.045 | 0 |
| 89.0 | 0.10 | 5 | 3.05 | 0.045 | 0 |
| 88.0 | 0.15 | 11 | 3.05 | 0.045 | 0 |
| 86.6 | 0.18 | 16 | 3.04 | 0.045 | 0.8 |
| 85.1 | 0.25 | 29 | 3.04 | 0.045 | 1.13 |
| 84.0 | 0.29 | 41 | 3.04 | 0.045 | 1.37 |
| 83.1 | 0.33 | 52 | 3.04 | 0.045 | 1.57 |
| 82.3 | 0.36 | 63 | 3.04 | 0.045 | 1.75 |
| 81.6 | 0.39 | 73 | 3.03 | 0.045 | 1.91 |
| 80.9 | 0.42 | 85 | 3.03 | 0.046 | 2.05 |
| 80.3 | 0.44 | 94 | 3.03 | 0.045 | 2.18 |
| 79.7 | 0.47 | 106 | 3.03 | 0.045 | 2.29 |

Each of the constants $d_{22}$ and $d_{31}$ is corrected on the basis of the Miller's rule.

A relationship between a phase matching angle variable in a range of 90°± about 10 and each of a wavelength and a refractive index of a fundamental harmonic, is shown in Table 2. It is to be noted that the wavelength of the output laser beam (second harmonic) is half of the wavelength of the fundamental harmonic.

TABLE 2

| phase matching angle (°) | wavelength of fundamental harmonic (nm) | refractive index |
|---|---|---|
| 100.3 | 415.00 | 1.68983 |
| 99.7 | 414.39 | 1.68995 |
| 99.1 | 413.78 | 1.69007 |
| 98.4 | 413.18 | 1.69019 |
| 97.7 | 412.57 | 1.69031 |
| 96.9 | 411.96 | 1.69040 |
| 96.0 | 411.35 | 1.69056 |
| 94.9 | 410.75 | 1.69068 |
| 93.4 | 410.14 | 1.69081 |
| 92.0 | 409.73 | 1.69089 |
| 91.0 | 409.58 | 1.69092 |
| 90.0 | 409.53 | 1.69093 |
| 89.0 | 409.58 | 1.69092 |
| 88.0 | 409.73 | 1.69089 |
| 86.6 | 410.14 | 1.69081 |
| 85.1 | 410.75 | 1.69068 |
| 84.0 | 411.35 | 1.69056 |
| 83.1 | 411.96 | 1.69040 |
| 82.3 | 412.57 | 1.69031 |
| 81.6 | 413.18 | 1.69019 |
| 80.9 | 413.78 | 1.69007 |
| 80.3 | 414.39 | 1.68995 |
| 79.7 | 415.00 | 1.68983 |

When the wavelength of the fundamental harmonic is 410.75 nm, if the phase matching angle is set to 85.1°, the magnitude of the effective nonlinear constant becomes 0.25, which value becomes about 5.4 times the constant $d_{31}$ (under NCPM) as a result of calculation. Since the output is nearly proportional to the square of the effective nonlinear constant, the output becomes about 29 times that under NCPM as a result of calculation; however, in actual, it becomes about eight times. This is because, the superposition of the beams is reduced and the optimum spot radius is changed due to walk off or the like.

Figure 15:
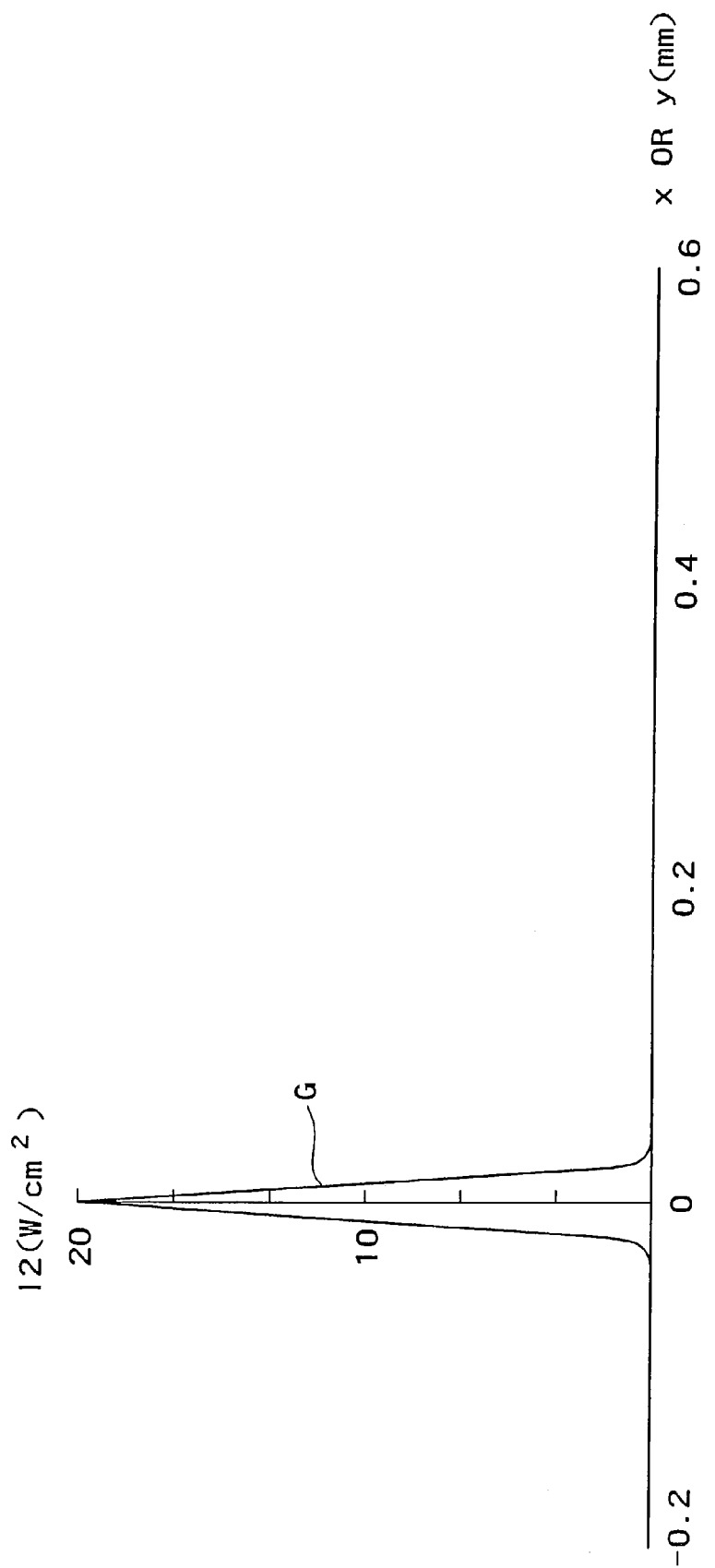
FIG. 15 is a graph showing one example of a beam intensity distribution in the case of using non critical phase matching (NCPM)

In the case of NCPM, for example, as shown in FIG. 15, the distribution of a beam intensity becomes a clear Gaussian distribution (two-dimensional orthogonal coordinates composed of the x-axis and the y-axis are set on a plane, and the x-axis or y-axis (unit: mm) is taken as the abscissa and a beam power I2 (unit: W/cm$^2$) per unit area is indicated on the ordinate, wherein the spot radius on the x-axis is equal to that on the y-axis). Even in the case of no NCPM, if the phase matching angle θ is 88° or more (or 92° or less), it is possible to obtain a beam having a nearly circular shape.

As the phase matching angle becomes smaller than 88° or becomes larger than 92°, the change in beam shape comes to cause a problem. That is to say, even if the incident beam has a circular shape, the beam shape after wavelength-conversion is changed due to walk off.

Figure 16:
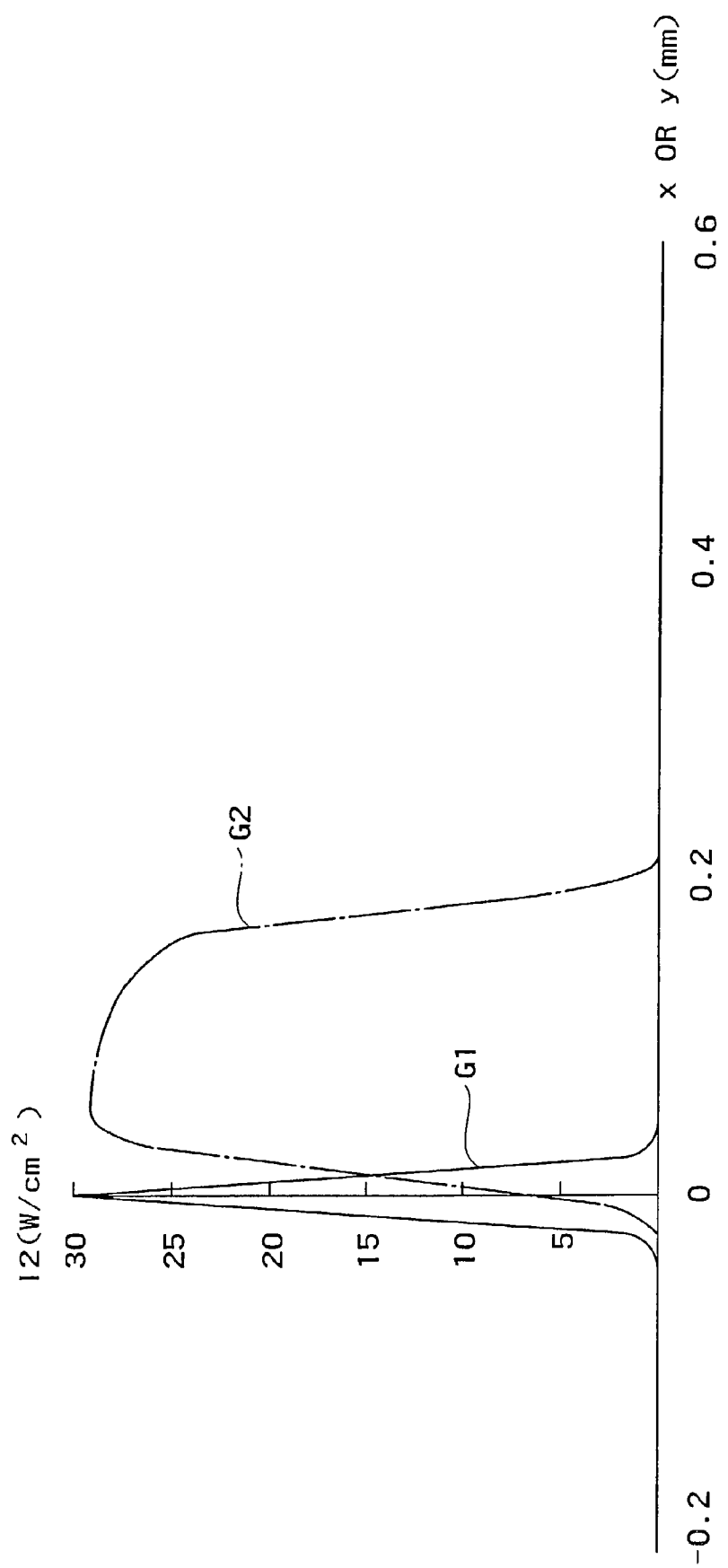
FIG. 16 is a graph showing one example of a beam intensity distribution in the case of a phase matching angle of 85.1°.

FIG. 16 is a graph, similar to the graph of FIG. 15, showing an example of a distribution shape of a beam at a phase matching angle θ=85.1°, wherein the x-axis or y-axis (unit: mm) is taken as the abscissa and a beam power I2 per unit area (unit: W/cm$^2$) is indicated on the ordinate.

In the figure, a curve G1 shown by a solid line has a beam shape with the abscissa taken as the x-axis, that is, the beam shape seen in the y-axis direction, and as is apparent from the figure, the curve G1 has a Gaussian distribution.

On the contrary, a curve G2 shown by a dotted chain line is a beam shape with the abscissa taken as the y-axis, that is, the beam shape seen from the x-axis direction, and as is apparent from the figure, the curve G2 has an asymmetric shape having a peak at a position slightly offset from y=0 in the normal direction.

Figure 17:
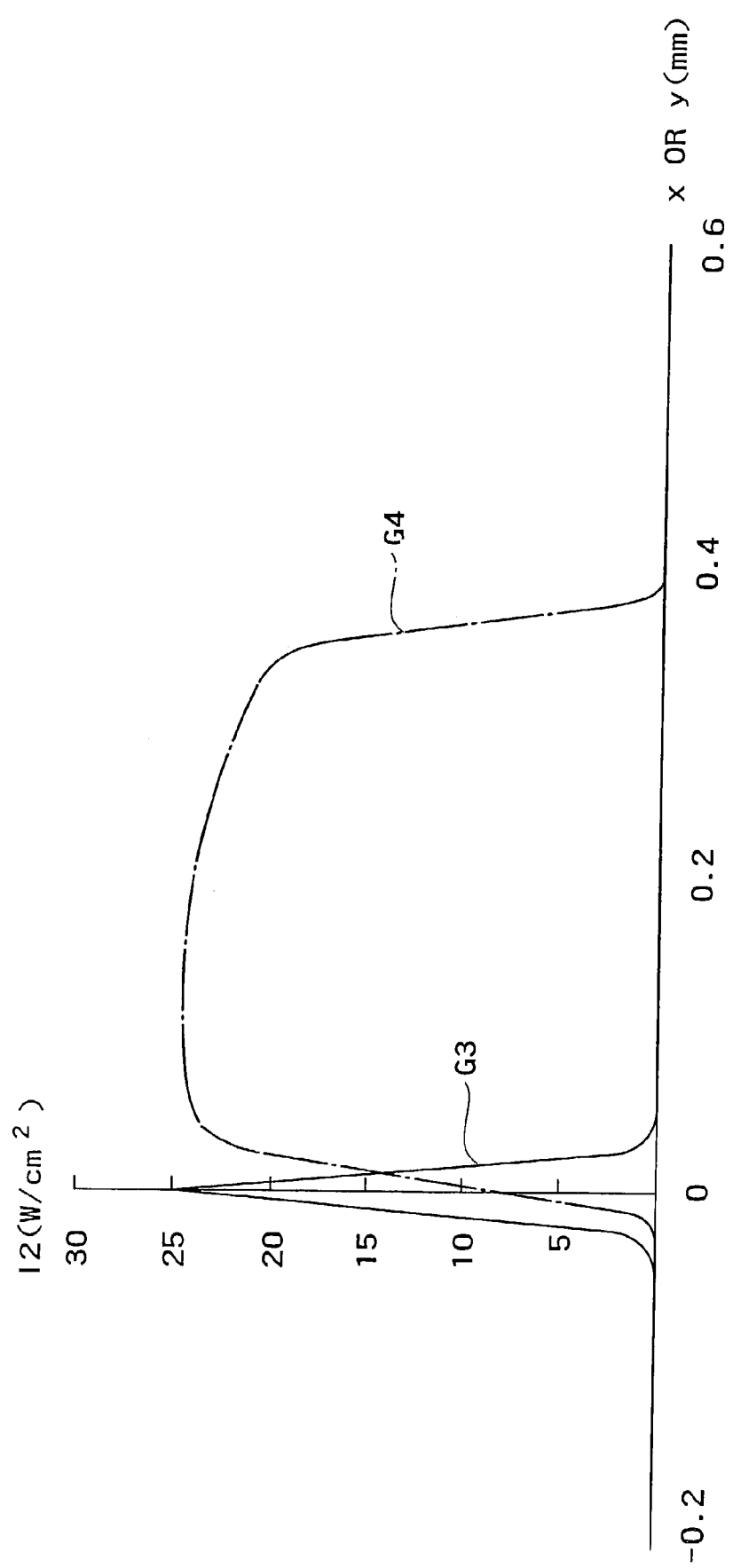
FIG. 17 is a graph showing one example of a beam intensity distribution in the case of a phase matching angle of 80.3°.

FIG. 17 is a graph showing an example of a distribution shape of a beam at a phase matching angle θ=80.3°, wherein the x-axis or y-axis (unit: mm) is taken as the abscissa and a beam power I2 per unit area (unit: W/cm$^2$) is indicated on the ordinate.

In the figure, a curve G3 shown by a solid line has a beam shape with the abscissa taken as the x-axis, that is, the beam shape seen in the y-axis direction, and as is apparent from the figure, the curve G3 has a Gaussian distribution.

On the contrary, a curve G4 shown by a dotted chain line is a beam shape with the abscissa taken as the y-axis, that is, the beam shape seen from the x-axis direction, and as is apparent from the figure, the curve G4 has an asymmetric shape having a peak at a position slightly offset from y=0 in the normal direction. The lateral width of the curve G4 in the y-axis direction is larger than the lateral width of the curve G2 shown in FIG. 16.

The change in beam shape can be somewhat covered by the design of an optical system disposed in such a manner as to be matched to the output of a beam (that is, since the light source is a coherent light source, the beam shape can be basically corrected by the optical design; however, under consideration of a load applied to the optical system, the phase matching angle is preferably set to be in a range of 80° or more, or 100° or less from the practical viewpoint. With respect to the critical value of the above range (80° or 100°), the aspect ratio of the output beam obtained from an axisymmetric input beam (incident beam from the laser light source 1) corresponds to a ratio of about 1:10. For example, the phase matching angle θ specified in the case of forming an elliptic beam having an aspect ratio of about 1:10 from an input beam having a radius of 33 μm is about 80° or 100°. If the phase matching angle is smaller than 80° or larger than 100°, the aspect ratio is degraded, thereby failing to perform optical correction. For example, an InGaN (Indium Gallium Nitride) laser for an optical disk having a wavelength band of about 400 to 415 nm has been developed. It is to be noted that the BBO crystal is required to be cooled for realizing an InGaN laser having a wavelength band of 400 to 409 nm. Such a wavelength band can be sufficiently, practically covered by the above range of the phase matching angle.

Accordingly, for the BBO crystal allowing phase matching under a condition of Type 1, a phase matching angle under no NCPM is preferably set to be in a range of 80° or more and less than 90° (or more than 90° and 100° or less). In addition, the semiconductor laser 1 is preferably configured as that having an output of 50 mW or more from the practical viewpoint.

The present invention configured as described above has the following advantages:

By desirably combining the semiconductor laser for outputting a laser beam in an ultraviolet region with a nonlinear optical crystal such as a BBO crystal, a deep ultraviolet laser beam having a wavelength of about 200 nm can be obtained by the minimum number (preferably, one time) of wavelength-conversion. As a result, it is possible to enhance the wavelength-conversion efficiency, to reduce power consumption, and to miniaturize a cooling apparatus. Also, since the size of the entire apparatus can be reduced, it is possible to reduce the cost.

In the case of no NCPM, by setting the phase matching angle to be slightly offset from 90° so as to take phase matching in the direction where the effective nonlinear constant becomes large (preferably, in the direction where one of the first and second terms in the equation (5) is added to the other, that is, the signs of both the terms are identical to each other), it is possible to further enhance the efficiency as compared with the case of NCPM.

While the preferred embodiments have been described using the specific terms, such description is for illustrative purposes only, and it is to be understood that changes and variations may be made without departing from the spirit or scope of the following claims.

What is claimed is:

1. A laser beam generating apparatus comprising:
   a. a gallium nitride semiconductor laser that produces a laser beam with a first wavelength,
   b. an external resonator comprising a nonlinear optical crystal,
   wherein;
   the nonlinear optical crystal produces a Type I phase matching angle and the nonlinear crystal is a barium borate ($\beta$-BaB$_2$O$_4$), and
   the laser beam produced by the semiconductor laser is directed by the external resonator so as to pass through the nonlinear optical crystal, to generate an ultraviolet beam having a second wavelength shorter than the first wavelength,
   c. a controller operatively configured and associated with the external resonator, and
   d. an effective nonlinear constant expressed by a first term containing an effective non-linear constant $d_{22}$ of the barium borate crystal and a second term containing an effective nonlinear constant $d_{31}$ of the barium borate crystal, wherein the phase matching angle is not 90°, and wherein the first and second terms are either both positive or both negative.

2. A laser beam generating apparatus according to claim 1, further comprising:
   temperature control means for maintaining the temperature of said barium borate crystal at 0° or less; and
   wherein,
   said ultraviolet laser beam is produced by second harmonic generation.

3. A laser beam generating apparatus according to claim 2, wherein in non critical phase matching of said barium borate, a ratio L/b between a crystal length L set to 10 mm or more and a confocal parameter $b=(2\pi n/\lambda)\cdot w^2$ is set to be equal or close to about 2.84, where n is a refractive index of a fundamental harmonic, $\lambda$ is a wavelength of the fundamental harmonic, and w is a spot radius when light is condensed in crystal, which spot radius is determined as the radius of a spot having an intensity of $e^{-2}$ on the assumption that the peak of a beam intensity is taken as 1.

4. A laser beam generating apparatus according to claim 3, wherein letting k be $2\pi n/\lambda$, the spot radius w is set to be within ±40% around $\sqrt{(L/(2.84k))}$.

5. A laser beam generating apparatus according to claim 1, wherein in non critical phase matching of said barium borate, a ratio L/b between a crystal length L set to 10mm or more and a confocal parameter $b=(2\pi n/\lambda)\cdot w^2$ is set to be equal or close to about 2.84, where n is a refractive index of a fundamental harmonic, $\lambda$ is a wavelength of the fundamental harmonic, and w is a spot radius when light is condensed in crystal, which spot radius is determined as the radius of a spot having an intensity of $e^{-2}$ on the assumption that the peak of a beam intensity is taken as 1.

6. A laser beam generating apparatus according to claim 5, wherein letting k be $2\pi n/\lambda$, the spot radius w is set to be within ±40% around $\sqrt{(L/(2.84 k))}$.

7. A laser beam generating apparatus according to claim 1, wherein the phase matching angle including a crystal orientation is set such that both the first term containing an effective non-linear constant $d_{22}$ of the barium borate crystal and the second term containing an effective nonlinear constant $d_{31}$ have the same positive or negative sign.

8. A laser beam generating apparatus according to claim 1, wherein said semiconductor laser has an output of 50 mm W or more.

9. A laser beam generating apparatus according to claim 1, wherein said semiconductor laser oscillates substantially with a longitudinal single mode.

10. A laser beam generating apparatus according to claim 1, wherein said semiconductor laser has a structure of a distribution feedback type or a distribution reflection type.

11. A laser beam generating apparatus according to claim 10, wherein said apparatus has a configuration of an external control type in which part of the laser beam produced by said semiconductor laser is fed back by spectral deviation or diffraction.

12. A laser beam generating apparatus according to claim 10, wherein an oscillation line width of said semiconductor laser is set to be equal to or less a transmission width of said external resonator.

13. A laser beam generating apparatus according to claim 1, wherein said external resonator is solely comprised of said barium borate crystal, and the resonance state is kept by temperature control of said barium borate crystal.

14. A laser beam generating apparatus according to claim 1, wherein said external resonator is solely comprised of said barium borate crystal, and the resonance state is kept by temperature control of said barium borate crystal.

15. A laser beam generating apparatus according to claim 1, wherein the Type I phase matching angle is set between a range of more than 80 and less than 90 or in a range of more than 90 and less than 100.

* * * * *